United States Patent
Yoo et al.

(10) Patent No.: US 10,790,267 B2
(45) Date of Patent: Sep. 29, 2020

(54) LIGHT EMITTING ELEMENT FOR PIXEL AND LED DISPLAY MODULE

(71) Applicant: LUMENS CO., LTD., Yongin-si, Gyeonggi-do (KR)

(72) Inventors: Taekyung Yoo, Yongin-si (KR); Seunghyun Oh, Yongin-si (KR); Sungsik Jo, Yongin-si (KR); Minpyo Kim, Yongin-si (KR); Jiyu Shin, Yongin-si (KR); Daewon Kim, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/047,912

(22) Filed: Jul. 27, 2018

(65) Prior Publication Data
US 2020/0013759 A1    Jan. 9, 2020

(30) Foreign Application Priority Data

Aug. 28, 2017 (KR) .................... 10-2017-0108410
Jan. 17, 2018 (KR) .................... 10-2018-0005997
(Continued)

(51) Int. Cl.
*H01L 25/075* (2006.01)
*H01L 33/62* (2010.01)
(Continued)

(52) U.S. Cl.
CPC ........ *H01L 25/0753* (2013.01); *H01L 25/167* (2013.01); *H01L 33/0093* (2020.05); *H01L 33/62* (2013.01)

(58) Field of Classification Search
None
See application file for complete search history.

(56) References Cited

U.S. PATENT DOCUMENTS

| 8,652,357 B2 * | 2/2014 | Ryu ...................... F21K 9/64 |
| | | 252/301.4 F |
| 2013/0214300 A1 * | 8/2013 | Lerman .................. F21K 9/64 |
| | | 257/88 |

(Continued)

*Primary Examiner* — Zandra V Smith
*Assistant Examiner* — Andre C Stevenson
(74) *Attorney, Agent, or Firm* — Mei & Mark LLP

(57) ABSTRACT

A light emitting element is disclosed. The light emitting element includes: a mount substrate on which a first electrode pad, a second electrode pad, a third electrode pad, and a fourth electrode pad are disposed; a first vertical LED chip mounted on the mount substrate such that the bottom portion of the first vertical LED chip is connected to the first electrode pad; a second vertical LED chip mounted on the mount substrate such that the bottom portion of the second vertical LED chip is connected to the second electrode pad; a third vertical LED chip mounted on the mount substrate such that the bottom portion of the third vertical LED chip is connected to the third electrode pad; a light-transmitting conductive plate electrically connected to the top portions of the first vertical LED chip, the second vertical LED chip, and the third vertical LED chip; and a conductor connecting the light-transmitting conductive plate to the fourth electrode pad. Individual driving powers are applied to the first vertical LED chip, the second vertical LED chip, and the third vertical LED chip through the first electrode pad, the second electrode pad, and the third electrode pad, respectively, or through the fourth electrode pad.

24 Claims, 25 Drawing Sheets

(30) Foreign Application Priority Data

Feb. 5, 2018 (KR) .................. 10-2018-0014089
Mar. 26, 2018 (KR) .................. 10-2018-0034570
May 17, 2018 (KR) .................. 10-2018-0056691

(51) Int. Cl.
*H01L 25/16* (2006.01)
*H01L 33/00* (2010.01)

(56) References Cited

U.S. PATENT DOCUMENTS

2013/0329440 A1* 12/2013 Tsutsumi .............. F21S 41/176
 362/465
2017/0345800 A1* 11/2017 Kobayakawa ...... H01L 25/0753
2017/0352791 A1* 12/2017 Kang .................... H01L 33/58

* cited by examiner

LIGHT EMITTING ELEMENT FOR PIXEL AND LED DISPLAY MODULE

BACKGROUND OF THE INVENTION

1. Field of the Invention

The present invention relates to a light emitting element for a pixel in which small-sized R, G, and B vertical LED chips are arranged at small intervals in a small area, thus being suitable for use as a display pixel, and an LED display module in which a plurality of pixel units, each including first, second, third, and fourth vertical LED chips, are arrayed between a mount substrate and a light-transmitting plate and are individually driven by light-transmitting electrode patterns formed on the light-transmitting plate and first, second, third, and fourth electrode pads formed on the substrate.

2. Description of the Related Art

In typical full-color LED display modules, pixels consist of red, green, and blue LEDs. LED display modules including pixels consisting of red, green, blue, and white LEDs have recently been proposed.

Package-on-module and chip-on-module technologies are employed to achieve RGB emission for the fabrication of LED display modules. According to the package-on-module technology, blue, green, and red LED packages are modularized and the modularized LED packages are applied to an LED display module. However, this technology is difficult to apply to the fabrication of small-sized display modules and has difficulty in achieving high resolution of display modules. According to the chip-on-module technology, blue, green, and red LED chips are directly mounted on a substrate rather than loaded into packages to fabricate a module. The chip-on-module technology is advantageous over the package-on-module technology in that display modules can be reduced in size, achieving improved resolution and color reproducibility.

Blue, green, and red LED chips that are currently in use as conventional chip structures are lateral chip structures or flip chip structures where top or bottom electrodes are needed. Thus, there remains a limitation in miniaturizing LED display modules. Particularly, the use of LED chips having lateral chip structures is disadvantageous in that bonding wires are further required.

Therefore, there is a need in the art for a technique that allows small-sized R, G, and B vertical LED chips to be arranged at smaller intervals in a smaller area.

SUMMARY OF THE INVENTION

It is one object of the present invention to provide a light emitting element in which a plurality of vertical LED chips are arranged at small intervals in a small area, thus being suitable for use as a display pixel.

It is another object of the present invention to provide an LED display module in which a plurality of pixel units, each including first, second, third, and fourth vertical LED chips, are arrayed between a mount substrate and a light-transmitting plate such that the constituent LED chips of the pixel units are arranged at smaller intervals in a smaller area and the plurality of pixel units are individually driven by light-transmitting electrode patterns formed on the light-transmitting plate and first, second, third, and fourth electrode pads formed on the substrate.

A light emitting element for a pixel according to one aspect of the present invention includes: a mount substrate on which a first electrode pad, a second electrode pad, a third electrode pad, and a fourth electrode pad are disposed; a first vertical LED chip mounted on the mount substrate such that the bottom portion of the first vertical LED chip is connected to the first electrode pad; a second vertical LED chip mounted on the mount substrate such that the bottom portion of the second vertical LED chip is connected to the second electrode pad; a third vertical LED chip mounted on the mount substrate such that the bottom portion of the third vertical LED chip is connected to the third electrode pad; a light-transmitting conductive plate electrically connected to the top portions of the first vertical LED chip, the second vertical LED chip, and the third vertical LED chip; and a conductor connecting the light-transmitting conductive plate to the fourth electrode pad, wherein individual driving powers are applied to the first vertical LED chip, the second vertical LED chip, and the third vertical LED chip through the first electrode pad, the second electrode pad, and the third electrode pad, respectively, or through the fourth electrode pad.

The fourth electrode pad may be a common input end or output end of the individual driving powers. When the fourth electrode pad is a common input end of the individual driving powers, the conductor directly connected to the fourth electrode pad is also a common input end of the individual driving powers. When the fourth electrode pad is a common output end of the individual driving powers, the conductor is also a common output end of the individual driving powers.

In other words, when the first electrode pad, the second electrode pad, and the third electrode pad are individual input ends, the fourth electrode pad (or the conductor connected to the fourth electrode pad) serves as a common output end. Alternatively, when the first electrode pad, the second electrode pad, and the third electrode pad are individual output ends, the fourth electrode pad (or the conductor connected to the fourth electrode pad) serves as a common input end.

The first, second, and third electrode pads are provided with switching controllers. The switching controllers control at the output sides when the first, second, and third electrode pads are output ends and control at the input sides when the first, second, and third electrode pads are input ends so that the RGB chips, i.e. the first vertical LED chip, the second vertical LED chip, and the third vertical LED chip, can be individually controlled.

Combinations of the first vertical LED chip, the second vertical LED chip, and the third vertical LED chip are defined to include a combination including all of the first vertical LED chip, the second vertical LED chip, and the third vertical LED chip, a combination including any two of the first vertical LED chip, the second vertical LED chip, and the third vertical LED chip, and a combination including one of the first vertical LED chip, the second vertical LED chip, and the third vertical LED chip.

In one embodiment, the first vertical LED chip, the second vertical LED chip, and the third vertical LED chip may be a blue LED chip, a green LED chip, and a red LED chip, respectively.

In one embodiment, the light-transmitting conductive plate may include indium tin oxide (ITO).

In one embodiment, the light-transmitting conductive plate may include a base of the light-transmitting plate and an indium tin oxide (ITO) pattern formed on the base of the light-transmitting plate.

In one embodiment, the light emitting element may further include an electrically insulating underfill filled between the mount substrate and the light-transmitting conductive plate.

In one embodiment, the top and bottom portions of the first vertical LED chip, the second vertical LED chip, and the third vertical LED chip may have opposite electrical polarities.

In one embodiment, each of the first vertical LED chip, the second vertical LED chip, and the third vertical LED chip may include an n-type semiconductor layer, an active layer, and a p-type semiconductor layer between the top and bottom portions thereof.

In one embodiment, at least one of the first vertical LED chip, the second vertical LED chip, and the third vertical LED chip may include a top surface free from a semiconductor layer growth substrate.

In one embodiment, the light emitting element may further include resistors arranged between the top portion of the first vertical LED chip and the conductor, between the top portion of the second vertical LED chip and the conductor, and between the top portion of the third vertical LED chip and the conductor under the light-transmitting conductive plate.

In one embodiment, the distance between the first vertical LED chip and the second vertical LED chip is preferably the same as that between the second vertical LED chip and the third vertical LED chip.

A method for manufacturing light emitting elements for pixels according to a further aspect of the present invention includes: preparing a mount substrate including a plurality of pad groups, each of which includes a first electrode pad, a second electrode pad, a third electrode pad, and a fourth electrode pad; mounting a plurality of first vertical LED chips on the mount substrate such that the bottom portions of the first vertical LED chips are connected to the first electrode pads; mounting a plurality of second vertical LED chips on the mount substrate such that the bottom portions of the second vertical LED chips are connected to the second electrode pads; mounting a plurality of third vertical LED chips on the mount substrate such that the bottom portions of the third vertical LED chips are connected to the third electrode pads; placing a plurality of conductors on the mount substrate such that the conductors are connected to the fourth electrode pads; attaching a light-transmitting conductive plate to the top portions of the first vertical LED chips, the second vertical LED chips, and the third vertical LED chips and the upper surfaces of the conductors to construct a panel; and cutting the panel into the individual pad groups.

In one embodiment, the mounting of first vertical LED chips includes preparing a first wafer including a sapphire substrate and a plurality of first vertical LED chips disposed on the sapphire substrate, bonding the bottom portions of the plurality of first vertical LED chips to the plurality of first electrode pads, and removing the sapphire substrate from the plurality of first vertical LED chips.

In one embodiment, the mounting of second vertical LED chips includes preparing a second wafer including a sapphire substrate and a plurality of second vertical LED chips disposed on the sapphire substrate, bonding the bottom portions of the plurality of second vertical LED chips to the plurality of second electrode pads, and removing the sapphire substrate from the plurality of second vertical LED chips.

An LED display module according to another aspect of the present invention includes: a mount substrate including a plurality of pad groups arrayed in a matrix thereon, each of the pad groups including a first electrode pad, a second electrode pad, a third electrode pad, and a fourth electrode pad; a light-transmitting plate spaced apart from the upper surface of the mount substrate and including a plurality of electrode patterns arrayed in a matrix thereon; and a plurality of pixel units located between the mount substrate and the light-transmitting plate arrayed in a matrix, wherein each of the plurality of pixel units includes a first vertical LED chip mounted on the mount substrate such that the bottom portion of the first vertical LED chip is connected to the first electrode pad, a second vertical LED chip mounted on the mount substrate such that the bottom portion of the second vertical LED chip is connected to the second electrode pad, a third vertical LED chip mounted on the mount substrate such that the bottom portion of the third vertical LED chip is connected to the third electrode pad, and a conductor connecting provided on the mount substrate such that the bottom portion of the conductor is connected to the fourth electrode pad, wherein the top portions of the first vertical LED chip, the second vertical LED chip, the third vertical LED chip, and the conductor are connected in common to one of the plurality of electrode patterns, and wherein the first vertical LED chips, the second vertical LED chips, and the third vertical LED chips are individually controlled such that the colors of light emitted from the pixel units are changed.

In one embodiment, the plurality of electrode patterns may be light transmissive.

In one embodiment, the plurality of electrode pads may be made of indium tin oxide (ITO) on one surface of a base of the light-transmitting plate.

In one embodiment, the mount substrate is preferably a TFT substrate.

In one embodiment, the first vertical LED chips, the second vertical LED chips, and the third vertical LED chips may be blue LED chips, green LED chips, and red LED chips, respectively.

In one embodiment, the LED display module may further include an electrically insulating underfill filled between the mount substrate and the light-transmitting plate.

In one embodiment, the top and bottom portions of the first vertical LED chips, the second vertical LED chips, and the third vertical LED chips may have opposite electrical polarities.

In one embodiment, each of the first vertical LED chips, the second vertical LED chips, and the third vertical LED chips may include an n-type semiconductor layer, an active layer, and a p-type semiconductor layer between the top and bottom portions thereof.

In one embodiment, at least one of the first vertical LED chip, the second vertical LED chip, and the third vertical LED chip in each of the pixel units may include a top surface free from a semiconductor layer growth substrate.

In one embodiment, the LED display module may further include resistors arranged between the top portion of the first vertical LED chip and the conductor, between the top portion of the second vertical LED chip and the conductor, and between the top portion of the third vertical LED chip and the conductor under the light-transmitting conductive plate in each of the pixel units.

In one embodiment, the distance between the first vertical LED chip and the second vertical LED chip is preferably the same as that between the second vertical LED chip and the third vertical LED chip in each of the pixel units.

According to the present disclosure, the plurality of vertical LED chips are arranged at small intervals in a small area. With this arrangement, the light emitting element of the present invention is suitable for use as a display pixel. Since the conductor connects the light-transmitting conductive plate (such as an ITO glass plate) to the fourth electrode pad on the mount substrate, the fourth electrode pad can be used as a common electrode pad, which enables miniaturization of the light emitting element. In addition, some circuit lines of the mount substrate can be omitted. Furthermore, the formation of the electrically insulating underfill filled between the mount substrate and the light-transmitting plate by an underfill process solves the problem of poor chip bonding caused by different coefficients of thermal expansion. In comparison with conventional light emitting elements, the light emitting element of the present invention can be manufactured in a short processing time because a short time is needed for wire bonding and can be greatly reduced in size.

According to the present disclosure, the plurality of pixel units are arrayed between the mount substrate and the light-transmitting plate in the LED display module. The first, second, third, and fourth vertical LED chips in each of the pixel units are individually driven by the light-transmitting electrode patterns formed on the light-transmitting plate and the first, second, third, and fourth electrode pads formed on the substrate. The constituent LED chips of the plurality of pixel units can be arranged at smaller intervals in a smaller area, enables the miniaturization of the LED display module. In addition, some circuit lines of the mount substrate can be omitted. Furthermore, the formation of the electrically insulating underfill filled between the mount substrate and the light-transmitting plate by an underfill process solves the problem of poor chip bonding caused by different coefficients of thermal expansion. In comparison with conventional light emitting elements, the light emitting element of the present invention can be manufactured in a short processing time because a short time is needed for wire bonding and can be greatly reduced in size.

It is substantially impossible to connect a common electrode to the top portions of vertical LED chips having a size of a few to a few hundreds of nanometers with bonding wires. Although possible, since the line thickness of the bonding wires is above a predetermined level, the upper light-emitting surfaces of the vertical LED chips are masked by the bonding wires, inevitably causing a considerable reduction in luminous efficiency. In contrast, according to the present disclosure, the vertical LED chips can be electrically connected to the common electrode without bonding wires.

According to the present disclosure, the micro-LED module of the present invention can be fabricated on a large scale by a method including forming the plurality of vertical LED chips emitting light of different wavelengths, the common electrodes, and a support layer, forming a mask with patterned holes thereon, and depositing a metal through the patterned holes to form patterned wiring layers. The patterned wiring layers can be formed with precision and fineness and the vertical LED chips can be further reduced in size, greatly contributing to an increase in the image quality of a display including the micro-LED module of the present invention.

According to the present disclosure, the micro-LED module of the present invention can be constructed such that the first vertical LED chips, the second vertical LED chips, and the third vertical LED chips can be individually driven by the individual bottom electrodes and the common electrodes connected to the individual top electrodes. The common electrodes may be connected to the patterned wiring layers. Alternatively, the patterned wiring layers per se may be used as the common electrodes. In this case, the area covered by the pixel units can be further reduced. Since the common electrodes for connecting the top portions of the first, second, and third vertical LED chips or the top electrodes are the patterned wiring layers rather than ITO or the light-transmitting plate having conductive patterns, the connection of the top portions of the first, second, and third vertical LED chips to the common electrodes can prevent the first, second, and third vertical LED chips from being inclined or tilted.

According to the present disclosure, the patterned wiring layers can be formed on the upper ends of the first, second, and third vertical LED chips by deposition based on through-silicon via (TSV), through-glass via (TGV) technology or its similar technology. In addition, the top electrodes of the micrometer-sized vertical LEDs can be precisely connected through the patterned wiring layers. When a general LED pixel unit having a package structure and including micrometer-sized vertical LED chips is directly connected to a PCB, the RGB LED chips are driven in parallel, causing variations in VF and current driving. In contrast, according to the present disclosure, the LED pixel unit can be controlled such that the vertical LED chips are individually current driven.

According to the present disclosure, the micrometer-sized vertical LED chips are bonded to a support substrate formed with connection parts through bump balls and the connection parts are connected to wirings of the mount substrate through solders, avoiding the occurrence of remelting during manufacture. Since deposition points for connecting micrometer-sized wires on the upper surfaces of vertical LED chips are weak, the deposition portions are prone to damage or separation during transport. In contrast, according to the present disclosure, the deposition of the patterned wiring layer on the support layer supporting all vertical LED chips in the LED pixel unit can prevent unwanted movements of the vertical LED chips, which can protect the patterned wiring layer from damage.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Embodiments A

Embodiment A-1

Figure 1A:
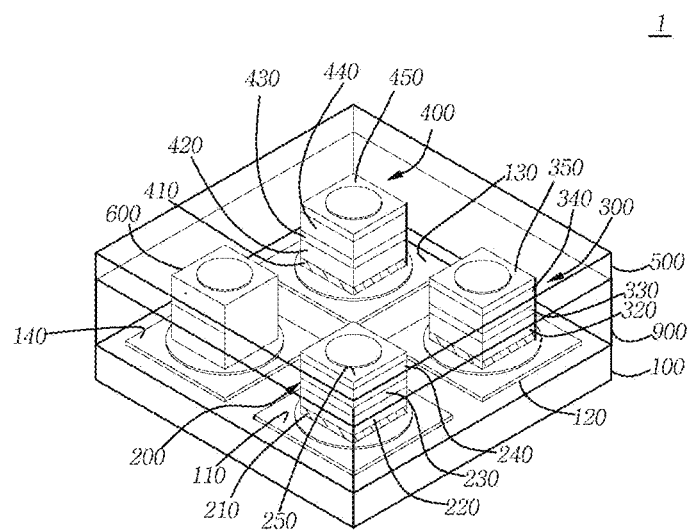
FIG. 1a is a perspective view illustrating a light emitting element for a pixel according to Embodiment A-1.
Figure 1B:
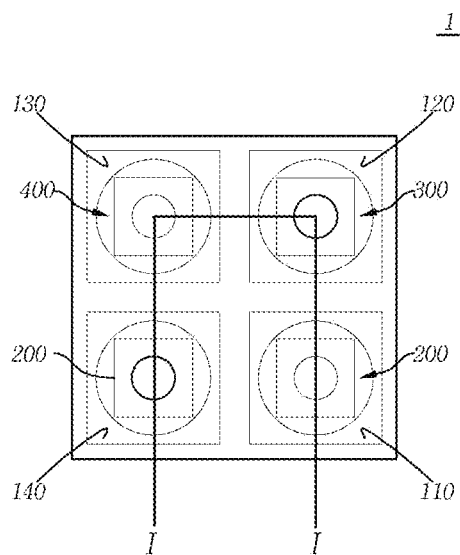
FIG. 1b is a plan view illustrating the light emitting element according to Embodiment A-1.

Referring to FIGS. 1a, 1b, 2, and 3, a light emitting element 1 for a pixel according to Embodiment A-1 includes a mount substrate 100, a first vertical LED chip 200, a second vertical LED chip 300, a third vertical LED chip 400, and a light-transmitting conductive plate 500.

The mount substrate 100 is substantially quadrangular in shape. A first electrode pad 110, a second electrode pad 120, a third electrode pad 130, and a fourth electrode pad 140 are disposed on the upper surface of the mount substrate 100. The electrode pads are arranged in a quadrangular array. The mount substrate 100 may be a printed circuit board (PCB).

The light-transmitting conductive plate 500 is spaced apart from the upper surface of the mount substrate 100. The light-transmitting conductive plate 500 can be made by coating indium tin oxide (ITO) on a light-transmitting plate such as a glass plate. ITO may be coated over the entire area of one surface of the light-transmitting plate or may be coated in a predetermined pattern.

The first vertical LED chip 200, the second vertical LED chip 300, and the third vertical LED chip 400 are sandwiched between the mount substrate 100 and the light-transmitting conductive plate 500. The upper or lower surface of a lateral type or flip-chip type LED chip is required to have a structure (for example, a stepped structure) through which semiconductor layers of opposite polarities are exposed. Due to this structure, there is a limitation in reducing the area of the upper or lower surface. In contrast, each of the first vertical LED chip 200, the second vertical LED chip 300, and the third vertical LED chip 400 requires only one top electrode and only one bottom electrode. Thus, there is no substantial limitation in reducing the areas of the upper and lower surfaces of the vertical LED chips. Therefore, the vertical LED chips can be integrated into an area corresponding to a conventional chip scale.

The first vertical LED chip 200 is a blue light emitting gallium nitride semiconductor chip and includes a top electrode 250 and a bottom electrode 210. The first vertical LED chip 200 includes a p-type semiconductor layer 220, an active layer 230, and an n-type semiconductor layer 240 formed in this order from the bottom to the top between the top electrode 250 and the bottom electrode 210.

The second vertical LED chip 300 is a green light emitting gallium nitride semiconductor chip and includes a top electrode 350 and a bottom electrode 310. The second vertical LED chip 300 includes a p-type semiconductor layer 320, an active layer 330, and an n-type semiconductor layer 340 formed in this order from the bottom to the top between the top electrode 350 and the bottom electrode 310.

The third vertical LED chip 400 is a red light emitting gallium arsenide semiconductor chip and includes a top electrode 450 and a bottom electrode 410. The third vertical LED chip 400 includes a p-type semiconductor layer 420, an active layer 430, and an n-type semiconductor layer 440 formed in this order from the bottom to the top between the top electrode 450 and the bottom electrode 410.

The top electrodes 250, 350, and 450 may be transparent electrodes such as ITO electrodes. The bottom electrodes 210, 310, and 410 may be metal electrodes. The top electrodes 250, 350, and 450 and/or the bottom electrodes 210, 310, and 410 are optional and may be omitted. In this case, the semiconductor layers or ohmic contact layers constitute the top portions and/or bottom portions of the corresponding LED chips.

In this embodiment, the bottom electrodes 210, 310, and 410 of the first vertical LED chip 200, the second vertical LED chip 300, and the third vertical LED chip 400 are connected to the p-type semiconductor layers 220, 320, and 420 and have a p-type polarity and the top electrodes 250, 350, and 450 of the first vertical LED chip 200, the second vertical LED chip 300, and the third vertical LED chip 400 are connected to the n-type semiconductor layers 240, 340, and 440 and have an n-type polarity.

The first vertical LED chip 200 is mounted on the mount substrate 100 such that the bottom electrode 210 is connected to the first electrode pad 110. The second vertical LED chip 300 is mounted on the mount substrate 100 such that the bottom electrode 310 is connected to the second electrode pad 120. The third vertical LED chip 400 is mounted on the mount substrate 100 such that the bottom electrode 410 is connected to the third electrode pad 130. A conductive adhesive b is used to attach the first vertical LED chip 200, the second vertical LED chip 300, and the third vertical LED chip 400 to the first electrode pad 110, the second electrode pad 120, and the third electrode pad 130, respectively.

The light emitting element 1 includes a rigid conductor 600 standing on the mount substrate 100. The lower end of the conductor 600 is connected to the fourth electrode pad 140. A conductive adhesive b is used to attach the rigid conductor 600 to the fourth electrode pad 140.

The light-transmitting conductive plate 500 is placed on and bonded to the top portions of the first vertical LED chip 200, the second vertical LED chip 300, and the third vertical LED chip 400 and the upper end of the conductor 600 so as to be connected to the top electrode 250 of the first vertical LED chip 200, the top electrode 350 of the second vertical LED chip 300, the top electrode 450 of the third vertical LED chip 400, and the upper end of the conductor 600. A conductive adhesive b is preferably used for attachment of the light-transmitting conductive plate 500.

The top electrodes 250, 350, and 450 of the first vertical LED chip 200, the second vertical LED chip 300, and the third vertical LED chip 400 connected to the light-transmitting conductive plate 500 act as individual electrode pads for driving the first vertical LED chip 200, the second vertical LED chip 300, and the third vertical LED chip 400. The fourth electrode pad 140 connected to the light-transmitting conductive plate 500 functions as a common electrode pad.

Due to the above-described construction, individual driving powers are applied to the first vertical LED chip 200, the second vertical LED chip 300, and the third vertical LED chip 400 through the first electrode pad 110, the second electrode pad 120, and the third electrode pad 130, respectively, or through the fourth electrode pad 140. The fourth electrode pad 140 may be a common input or output end of the individual driving powers. Here, when the fourth electrode pad 140 is a common input end of the individual driving powers, the conductor 600 directly connected to the fourth electrode pad 140 is also a common input end of the individual driving powers. When the fourth electrode pad 140 is a common output end of the individual driving powers, the conductor 600 is also a common output end of the individual driving powers.

That is to say, the fourth electrode pad 140 or the conductor 600 connected to the fourth electrode pad 140 serves as a common output end when the first electrode pad 110, the second electrode pad 120, and the third electrode pad 130 are individual input ends and serves as a common input end when the first electrode pad 110, the second electrode pad 120, and the third electrode pad 130 are individual output ends.

Furthermore, the first, second, and third electrode pads 110, 120, and 130 are provided with switching controllers (not illustrated). The switching controllers control at the output sides when the first, second, and third electrode pads 110, 120, and 130 are output ends and control at the input sides when the first, second, and third electrode pads 110, 120, and 130 are input ends so that the RGB chips, i.e. the first vertical LED chip 200, the second vertical LED chip 300, and the third vertical LED chip 400, can be individually controlled.

Accordingly, light of various colors can be emitted from combinations of the individually controllable first, second, and third vertical LED chips 200, 300, and 400 that are individually controllable, thus achieving full-color display. It is preferred that the distance between the first vertical LED chip 200 and the second vertical LED chip 300 is the same as that between the second vertical LED chip 300 and the third vertical LED chip 400, resulting in high color uniformity of light emitted from the light emitting element 1.

An electrically insulating underfill 900 is filled between the mount substrate 100 and the light-transmitting conductive plate 500 to protect the first vertical LED chip 200, the second vertical LED chip 300, and the third vertical LED chip 400 from the external environment.

For high color conversion efficiency, the mount substrate 100 is made of a black, white or transparent material and the side surfaces of the vertical LED chips 200, 300, and 400 may be covered with a molding material. The molding material may be black or white in color. A general mount substrate is made of a ceramic material or FR 4/CEM and may be black or white in color. Electrodes are formed through via formation. Alternatively, a mount substrate may also be made of transparent glass or a transparent plastic resin, which is optionally mixed with a transparent or black compound. In this case, electrodes are formed through via formation or side metal deposition.

Referring now to FIGS. 4 to 11, a method for manufacturing the light emitting element according to Embodiment A-1 will be explained. It is noted that the orientations in FIGS. 4 to 11 are intended to match those in FIGS. 1a, 1b, 2, and 3 and are independent of the actual orientations and directions during manufacture of the light emitting element.

Figure 4:
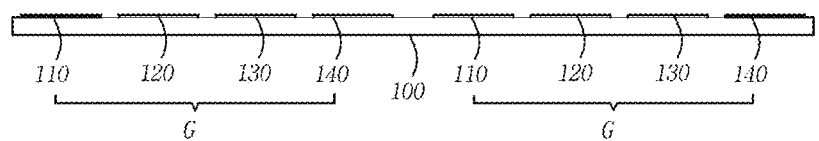
FIGS. 4 to 11 are views explaining a method for manufacturing the light emitting element according to Embodiment A-1.

Referring first to FIG. 4, a mount substrate 100 including a plurality of pad groups G on one surface (upper surface) thereof is prepared. Each of the pad groups includes a first electrode pad 110, a second electrode pad 120, a third electrode pad 130, and a fourth electrode pad 140. The mount substrate 100 may be, for example, a printed circuit board (PCB). The mount substrate 100 may be further provided with various elements such as switches.

Next, a first vertical LED chip, a second vertical LED chip, and a third vertical LED chip are mounted on the mount substrate 100. In this embodiment, each of the first vertical LED chip and the second vertical LED chip includes a gallium nitride semiconductor layer grown on a sapphire substrate. The sapphire substrate needs to be removed during mounting on the mount substrate, as will be explained below. The third vertical LED chip includes a gallium arsenide semiconductor layer grown on a growth substrate. The growth substrate may be removed during mounting on the mount substrate. However, it is noted that the removal of the growth substrate is not essential when the growth substrate is conductive.

Figure 5:
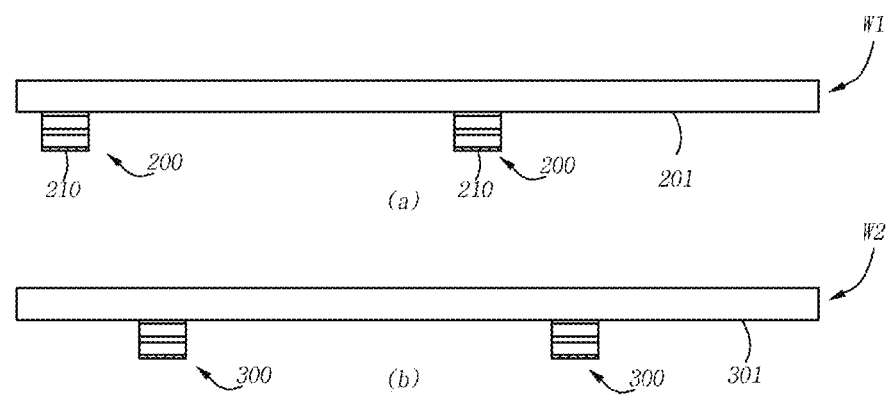

As illustrated in (a) of FIG. 5, a first wafer W1 including a sapphire substrate 201 and a plurality of first vertical LED chips 200 formed on the sapphire substrate 201 is prepared. A bottom electrode 210 is formed on each of the plurality of first vertical LED chips 200. Each of the first vertical LED chips 200 includes a gallium nitride n-type semiconductor layer, an active layer, and a p-type semiconductor layer grown on the sapphire substrate. This is the initial step of mounting the first vertical LED chips.

As illustrated in (b) of FIG. 5, a second wafer W2 including a sapphire substrate 301 and a plurality of second vertical LED chips 300 formed on the sapphire substrate 301 is prepared. A bottom electrode 310 is formed on each of the plurality of second vertical LED chips 300. Each of the second vertical LED chips 300 includes a gallium nitride n-type semiconductor layer, an active layer, and a p-type semiconductor layer grown on the sapphire substrate. This is the initial step of mounting the second vertical LED chips.

Figure 6:
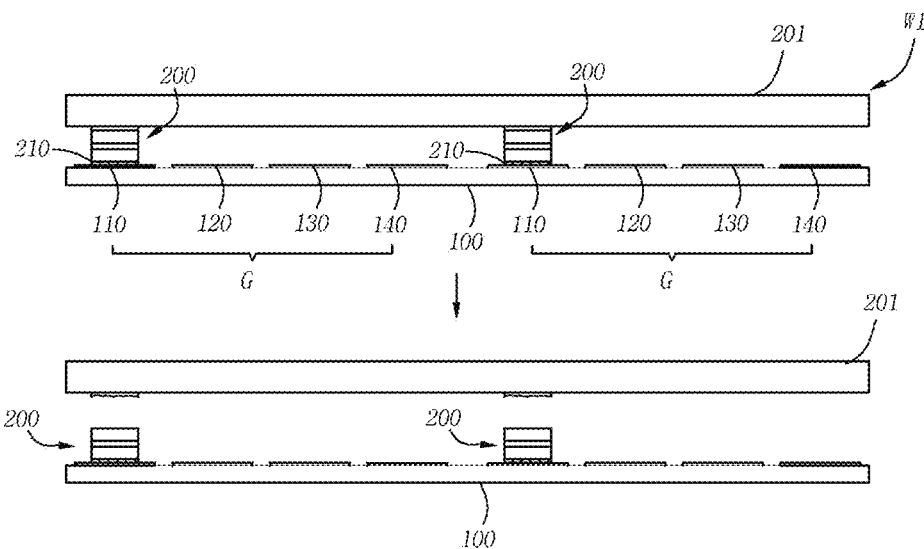

Next, as illustrated in FIG. 6, the first wafer W1 is mounted on the mount substrate 100 and subsequently the sapphire substrate 201 is removed from the plurality of first vertical LED chips 200 to bond the plurality of bottom electrodes 210 to the plurality of first electrode pads 110, with the result that the plurality of first vertical LED chips 200 left after removal of the sapphire substrate 201 remain mounted on the mount substrate 100. Preferably, a laser lift-off (LLO) process is employed to remove the sapphire substrate 201 and a transfer printing process is employed to mount the first wafer W1 on the mount substrate 100.

Figure 7:
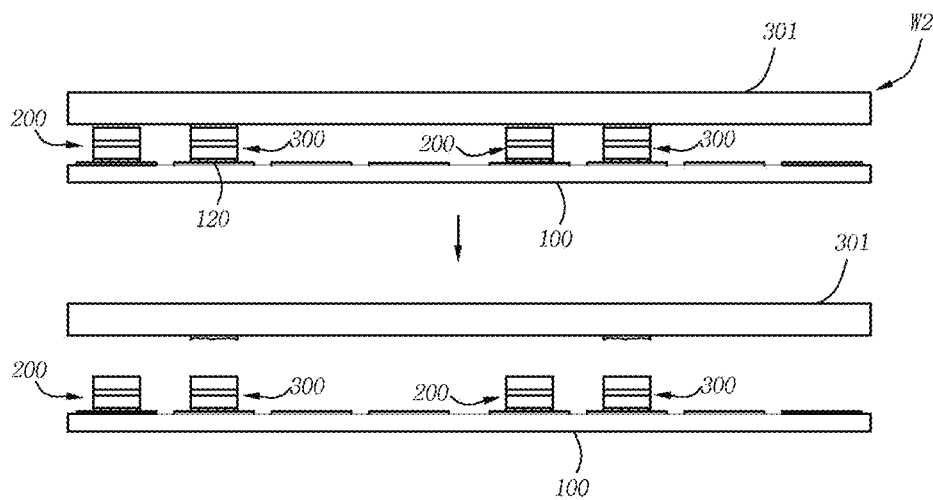

As illustrated in FIG. 7, the second wafer W2 is mounted on the mount substrate 100 and subsequently the sapphire substrate 301 is removed from the plurality of second vertical LED chips 300 to bond the plurality of bottom electrodes 310 to the plurality of second electrode pads 120, with the result that the plurality of second vertical LED chips 300 left after removal of the sapphire substrate 301 remain mounted on the mount substrate 100. Preferably, a laser lift-off (LLO) process is employed to remove the sapphire substrate 301 and a transfer printing process is employed to mount the second wafer W2 on the mount substrate 100.

Figure 8:
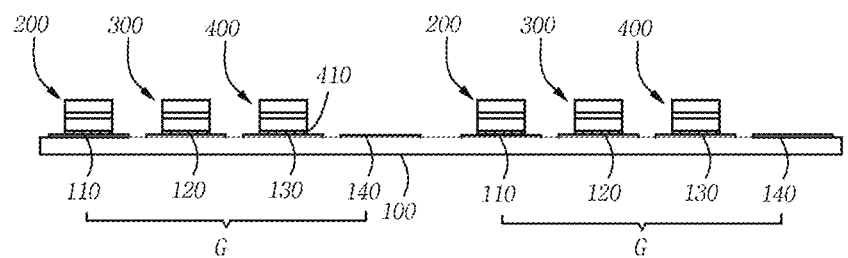

After mounting of the plurality of first vertical LED chips 200 on the mount substrate 100 to connect the bottom electrodes 210 to the first electrode pads 110 and mounting of the plurality of second vertical LED chips 300 on the mount substrate 100 to connect the bottom electrodes 310 to the second electrode pads 120, a plurality of third vertical LED chips 400 are mounted on the mount substrate 100 to connect bottom electrodes 410 to the third electrode pads 130, as illustrated in FIG. 8. To this end, a wafer including a substrate and the third vertical LED chips 400 is mounted on the mount substrate 100 and the substrate is then separated, similarly to the mounting of the first and second vertical LED chips. Alternatively, the third vertical LED chips 400 per se may be mounted without using a wafer.

Figure 9:
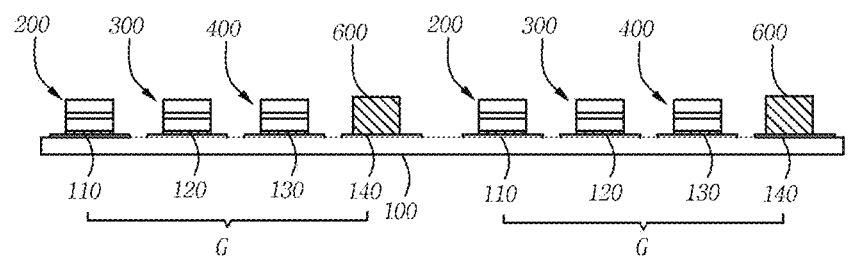

Next, as illustrated in FIG. 9, a plurality of vertically elongated rod-like conductors 600 are connected to the fourth electrode pads 140 on the mount substrate 100. The conductors 600 are made of a highly conductive metal such as Cu, Au, Ag or its alloy. The conductors 600 may be previously prepared before bonding to the mount substrate 100. Alternatively, the conductors 600 may be directly prepared on the mount substrate 100.

Figure 10:
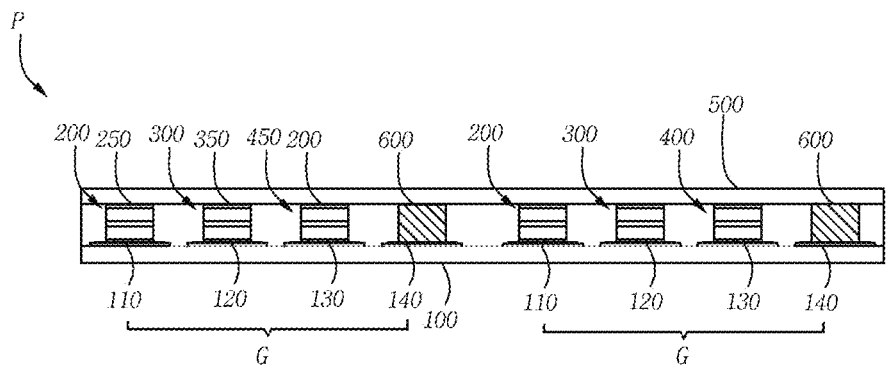

Next, as illustrated in FIG. 10, a light-transmitting conductive plate 500 is placed on and bonded to top electrodes 250, 350, and 450 of the first vertical LED chips 200, the second vertical LED chips 300, and the third vertical LED chips 400 to construct a panel P. The top electrodes 250, 350, and 450 are preferably transparent electrodes. However, the top electrodes 250, 350, and 450 are optional and may be omitted.

The light-transmitting conductive plate 500 can be formed by coating a transparent conductive material such as ITO on the bottom surface of a light-transmitting plate such as a glass plate. Alternatively, the light-transmitting conductive plate 500 may be made of a single plate material that is light transmissive and conductive. An insulating underfill 900 may be filled between the light-transmitting conductive plate 500 and the mount substrate 100 during construction of the panel P.

The panel P has a structure in which the first vertical LED chips, the second vertical LED chips, the third vertical LED chips, and the conductors are interposed between the large-area light-transmitting conductive plate and the large-area mount substrate.

Finally, the panel P is cut into the individual pad groups G, completing manufacture of the plurality of light emitting elements 1. The light emitting elements 1 are exemplified in FIGS. 1 to 3.

Embodiment A-2

Figure 12:
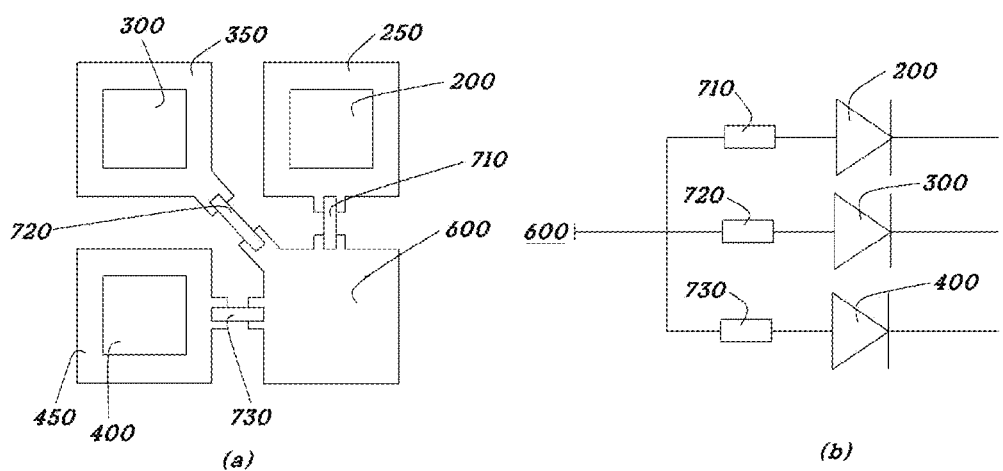
FIG. 12 illustrates a light emitting element for a pixel according to Embodiment A-2 in which resistors are arranged between the top portion of a first vertical LED chip and a conductor, between the top portion of a second vertical LED chip and the conductor, and between the top portion of a third vertical LED chip and the conductor under a light-transmitting conductive plate.
Figure 13:
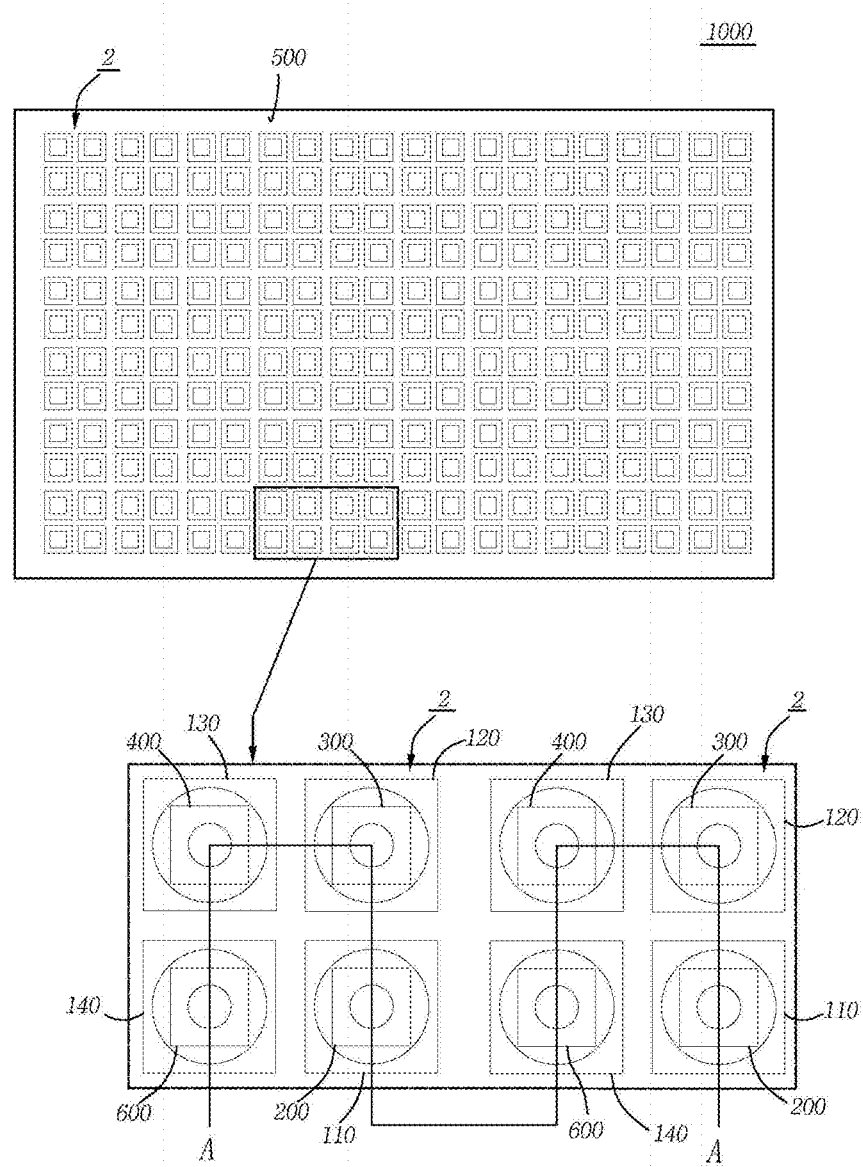
FIG. 13 is a plan view illustrating an LED display module according to Embodiment A-3.
Figure 14:
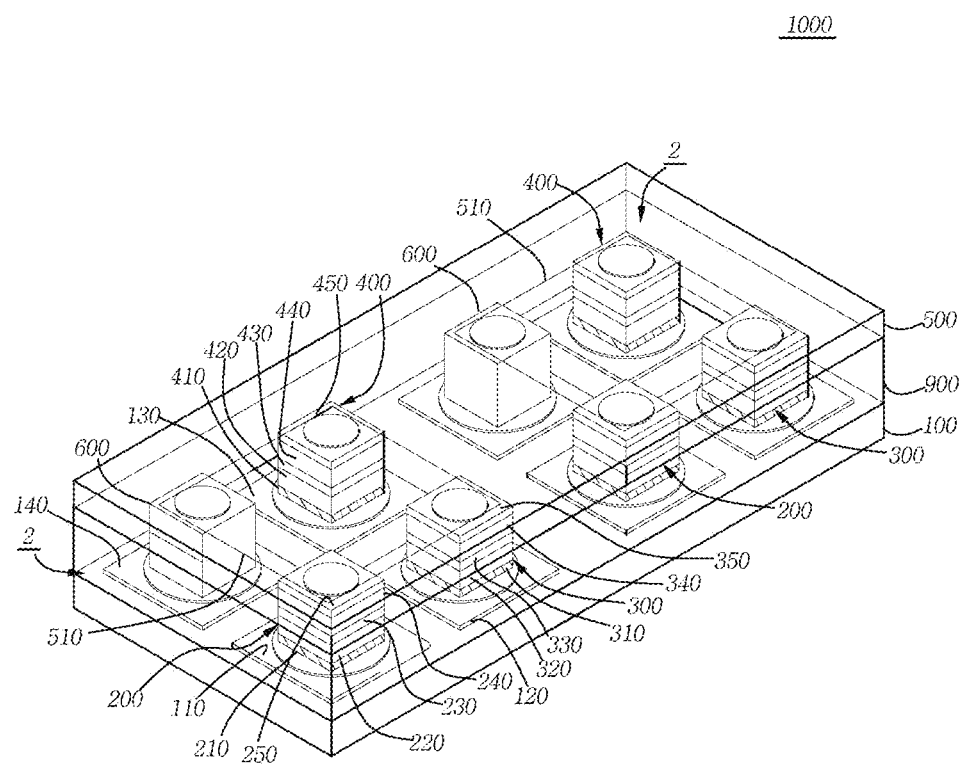
FIG. 14 is a partially enlarged perspective view illustrating the LED display module according to Embodiment A-3.
Figure 15:
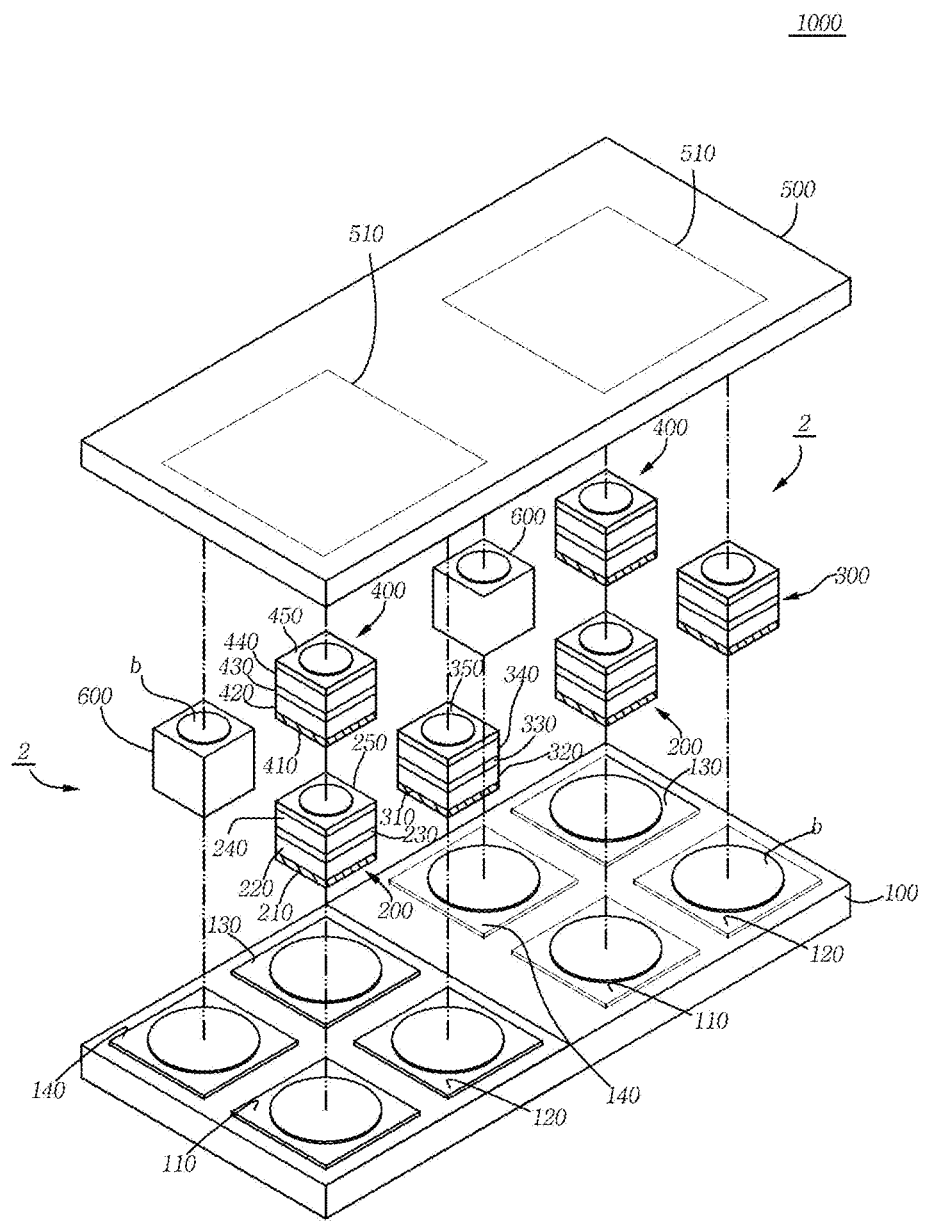
FIG. 15 is an exploded perspective view of the LED display module illustrated in FIG. 14.
Figure 16:
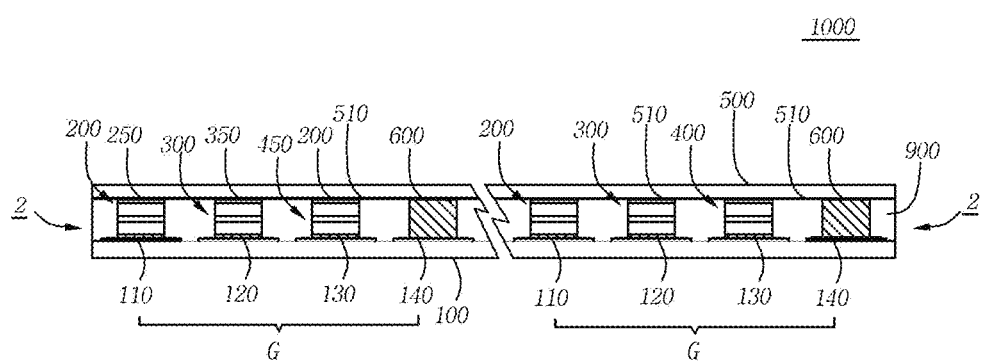
FIG. 16 is a cross-sectional view taken along line A-A of FIG. 13.

In this embodiment, resistors may be further arranged under the light-transmitting conductive plate 500 to achieve white emission, as illustrated in FIG. 12. FIG. 12 illustrates a light emitting element for a pixel according to Embodiment A-2. As illustrated in (a) of FIG. 12, resistors 710, 720, and 730 are arranged between the top portion of the first vertical LED chip 200 and the conductor 600, between the top portion of the second vertical LED chip 300 and the conductor 600, and between the top portion of the third vertical LED chip 400 and the conductor 600 under the light-transmitting conductive plate 500 (see FIG. 1a or 2). (b) of FIG. 12 is an equivalent circuit diagram of the structure illustrated in (a). This arrangement of the resistors 710, 720, and 730 can achieve white emission. Furthermore, an integrated circuit (IC) may be further arranged under the light-transmitting conductive plate 500, achieving full-color display.

Embodiment A-3

Referring to FIGS. 13 to 16, an LED display module 1000 according to Embodiment A-3 includes a rectangular mount substrate 100, a light-transmitting conductive plate 500 having almost the same shape and area as the mount substrate 100 and spaced apart from the mount substrate 100, and a plurality of pixel units 2 arrayed in a matrix between the mount substrate 100 and the light-transmitting conductive plate 500. Each of the plurality of pixel units 2 includes a first vertical LED chip 200, a second vertical LED chip 300, a third vertical LED chip 400, and a conductor 600.

The mount substrate 100 includes a plurality of pad groups G arrayed in a matrix and corresponding to the plurality of pixel units 2 on the upper surface thereof. Each of the plurality of pad groups G includes a first electrode pad 110, a second electrode pad 120, a third electrode pad 130, and a fourth electrode pad 140 disposed in a substantially rectangular array on the upper surface of the mount substrate 100. The mount substrate 100 may be a thin film transistor (TFT) substrate or a printed circuit board (PCB) but is preferably a TFT substrate.

As mentioned previously, the light-transmitting conductive plate 500 is spaced a distance from the upper surface of the mount substrate 100. The light-transmitting plate 500 includes a plurality of light-transmitting electrode patterns 510 formed by coating a conductive material (such as indium tin oxide (ITO)) on an insulating base of the light-transmitting plate (such as glass). The plurality of light-transmitting electrode patterns 510 are arrayed corresponding to the array of the plurality of pixel units 2 or the array of the plurality of pad groups G.

The first vertical LED chips 200, the second vertical LED chips 300, and the third vertical LED chips 400 are sandwiched between the mount substrate 100 and the light-transmitting conductive plate 500. The upper or lower surface of a lateral type or flip-chip type LED chip is required to have a structure (for example, a stepped structure) through which semiconductor layers of opposite polarities are exposed. Due to this structure, there is a limitation in reducing the area of the upper or lower surface. In contrast, each of the first vertical LED chip 200, the second vertical LED chip 300, and the third vertical LED chip 400 requires only one top electrode and only one bottom electrode. Thus, there is no substantial limitation in reducing the areas of the upper and lower surfaces of the vertical LED chips. Therefore, the vertical LED chips can be integrated into an area corresponding to a conventional chip scale.

The first vertical LED chips 200 are blue light emitting gallium nitride semiconductor chips and each includes a top electrode 250 and a bottom electrode 210. Each of the first vertical LED chips 200 includes a p-type semiconductor layer 220, an active layer 230, and an n-type semiconductor layer 240 formed in this order from the bottom to the top between the top electrode 250 and the bottom electrode 210.

The second vertical LED chips 300 are green light emitting gallium nitride semiconductor chips and each includes a top electrode 350 and a bottom electrode 310. Each of the second vertical LED chips 300 includes a p-type semiconductor layer 320, an active layer 330, and an n-type semiconductor layer 340 formed in this order from the bottom to the top between the top electrode 350 and the bottom electrode 310.

The third vertical LED chips 400 are red light emitting gallium arsenide semiconductor chips and each includes a top electrode 450 and a bottom electrode 410. Each of the third vertical LED chips 400 includes a p-type semiconductor layer 420, an active layer 430, and an n-type semiconductor layer 440 formed in this order from the bottom to the top between the top electrode 450 and the bottom electrode 410.

The top electrodes 250, 350, and 450 may be transparent electrodes such as ITO electrodes and the bottom electrodes 210, 310, and 410 may be metal electrodes. The top electrodes 250, 350, and 450 and/or the bottom electrodes 210, 310, and 410 may be omitted. In this case, the semiconductor layers or ohmic contact layers constitute the top portions and/or bottom portions of the corresponding LED chips.

In this embodiment, the bottom electrodes 210, 310, and 410 of the first vertical LED chips 200, the second vertical LED chips 300, and the third vertical LED chips 400 are connected to the corresponding p-type semiconductor layers 220, 320, and 420 and have a p-type polarity. The top electrodes 250, 350, and 450 of the first vertical LED chips 200, the second vertical LED chips 300, and the third vertical LED chips 400 are connected to the corresponding n-type semiconductor layers 240, 340, and 440 and have an n-type polarity.

The first vertical LED chips 200 are mounted on the mount substrate 100 such that the bottom electrodes 210 are connected to the first electrode pads 110. The second vertical LED chips 300 are mounted on the mount substrate 100 such that the bottom electrodes 310 are connected to the second electrode pads 120. The third vertical LED chips 400 are mounted on the mount substrate 100 such that the bottom electrodes 420 are connected to the third electrode pads 430. A conductive adhesive b is used to attach the first vertical LED chips 200, the second vertical LED chips 300, and the third vertical LED chips 400 to the first electrode pads 110, the second electrode pads 120, and the third electrode pads 130, respectively.

The conductors 600 have sufficient rigidity and stand on the mount substrate 100 so as to be connected to the fourth electrode pads 140 of the pad groups. A conductive adhesive b is used to attach the rigid conductors 600 to the fourth electrode pads 140.

As mentioned earlier, the light-transmitting plate 500 includes a plurality of light-transmitting electrode patterns 510 (only two electrode patterns are illustrated in the figures) spaced apart from one another and arrayed in a matrix. The light-transmitting plate 500 is placed on and bonded to the top portions of the first vertical LED chips 200, the second vertical LED chips 300, and the third vertical LED chips 400 and the upper ends of the conductors 600 such that the top electrodes 250 of the first vertical LED chips 200, the top electrodes 350 of the second vertical LED chips 300, the top electrodes 450 of the third vertical LED chips 400, and the upper ends of the conductors 600 of the pixel units 2 in the pixel units 2 are connected to the corresponding light-transmitting electrode patterns 510.

A conductive adhesive b is preferably used for attachment of the light-transmitting conductive plate 500.

Since the light-transmitting electrode patterns 510 formed on the light-transmitting conductive plate 500 are connected to the top electrodes 250, 350, and 450 of the first vertical LED chips 200, the second vertical LED chips 300, the third vertical LED chips 400, and the upper ends of the conductors 600 in the corresponding pixel units 2, the first electrode pads 110, the second electrode pads 120, and the third electrode pads 130 serve as individual electrode pads for driving the first vertical LED chips 200, the second vertical LED chips 300, and the third vertical LED chips 400, respectively, and the fourth electrode pads 140 function as common electrode pads. Thus, the first vertical LED chip 200, the second vertical LED chip 300, and the third vertical LED chip 400 in the pixel units 2 can be individually controlled so that the colors of light emitted from the pixel units can be changed, achieving full-color display.

It is preferred that the distance between the first vertical LED chip 200 and the second vertical LED chip 300 is the same as that between the second vertical LED chip 300 and the third vertical LED chip 400, resulting in high color uniformity of light emitted from each pixel unit 2.

An electrically insulating underfill 900 may be filled between the mount substrate 100 and the light-transmitting conductive plate 500 to protect the first vertical LED chips 200, the second vertical LED chips 300, and the third vertical LED chips 400 from the external environment.

For high color conversion efficiency, the mount substrate 100 is made of a black, white or transparent material and the side surfaces of the vertical LED chips 200, 300, and 400 may be covered with a molding material. The molding material may be black or white in color. A general mount substrate is made of a ceramic material or FR 4/CEM and may be black or white in color. Electrodes are formed through via formation. Alternatively, a mount substrate may also be made of transparent glass or a transparent plastic resin, which is optionally mixed with a transparent or black compound. In this case, electrodes are formed through via formation or side metal deposition.

Figure 11:
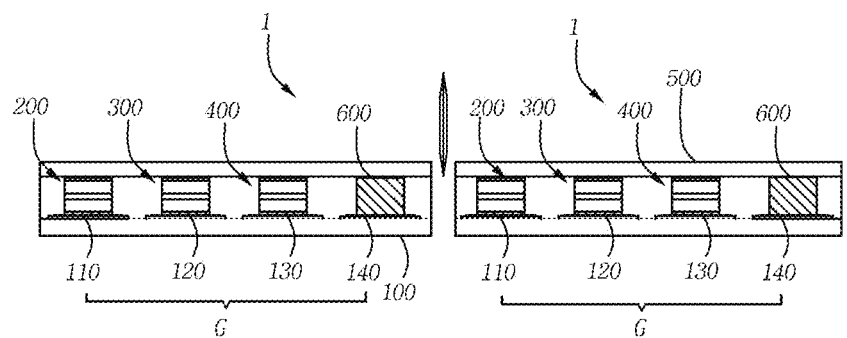

The method according to this embodiment is substantially the same as the method for manufacturing the pixel element according to the previous embodiment with reference to FIGS. 4 to 10, except that the LED display module includes a plurality of pixels without being separated into individual pixel units, unlike in FIG. 11, and a detailed description thereof is omitted to avoid duplication.

Embodiment A-4

Figure 17:
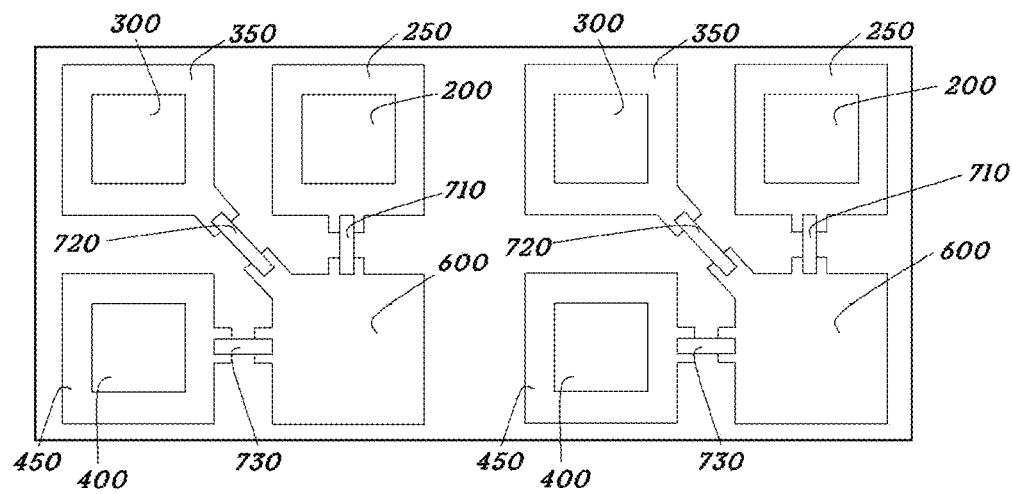
FIG. 17 illustrates an LED display module according to Embodiment A-4 in which resistors are arranged between the top portions of first vertical LED chips and conductors, between the top portions of second vertical LED chips and the conductors, and between the top portions of third vertical LED chips and the conductors under a light-transmitting conductive plate.

FIG. 17 illustrates an LED display module according to Embodiment A-4 in which resistors are arranged between the top portions of first vertical LED chips and conductors, between the top portions of second vertical LED chips and the conductors, and between the top portions of third vertical LED chips and the conductors under a light-transmitting conductive plate.

Referring to FIG. 17, the resistors 710, 720, and 730 are arranged under the light-transmitting conductive plate 500. In each pixel unit, the resistors 710, 720, and 730 are arranged between the top portion of the first vertical LED chip 200 and the conductor 600, between the top portion of the second vertical LED chip 300 and the conductor 600, and between the top portion of the third vertical LED chip 400 and the conductor 600 under the light-transmitting plate 500 (see FIG. 13). This arrangement of the resistors 710, 720, and 730 can achieve white emission. Furthermore, an integrated circuit (IC) may be further arranged under the light-transmitting conductive plate 500, achieving full-color display.

In this embodiment, the top electrodes 250, 350, and 450 of the first vertical LED chips 200, the second vertical LED chips 300, and the third vertical LED chips 400 may be light-transmitting electrode patterns formed on the bottom surface of the light-transmitting conductive plate 500. Accordingly, the resistors 710, 720, and 730 connect the top electrodes 250, 350, and 450 of the first vertical LED chips 200, the second vertical LED chips 300, and the third vertical LED chips 400 to the top portions of the conductors 600, respectively.

Embodiments B

Embodiment B-1

Figure 18:
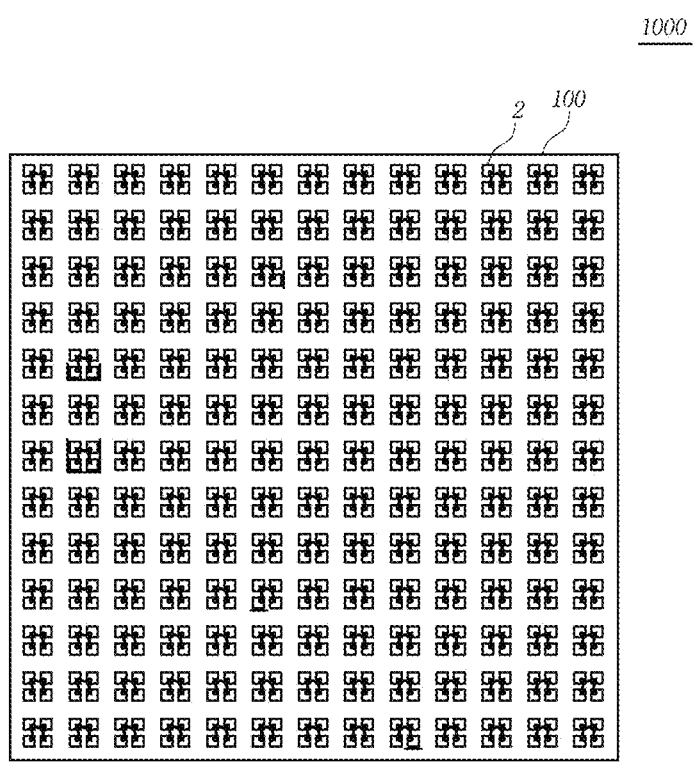
FIG. 18 is a plan view illustrating a micro-LED module according to Embodiment B-1 in which a plurality of pixel units are arrayed in a matrix.

Referring to FIG. 18, a micro-LED module according to Embodiment B-1 includes a rectangular or square mount substrate 100 and a plurality of pixel units 2 arrayed in a matrix on the mount substrate 100. It is noted that an LED module including one mount substrate 100 and one pixel unit 2 located thereon is also within the scope of the present invention.

Figure 19:
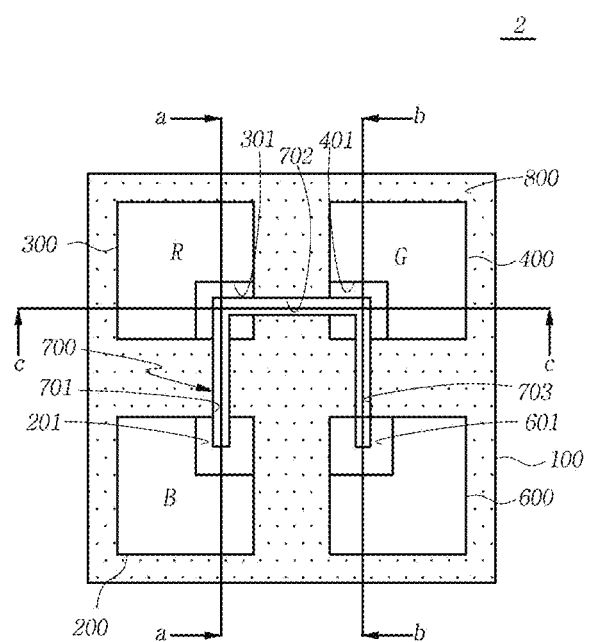
FIG. 19 is an enlarged plan view illustrating one of the pixel units illustrated in FIG. 18.
Figure 20:
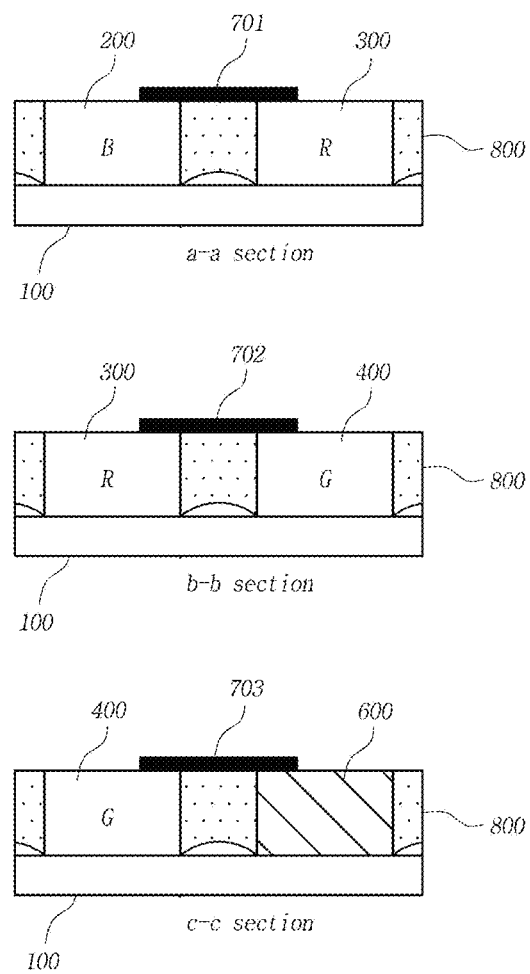
FIG. 20 illustrates cross-sectional views taken along lines a-a, b-b, and c-c of FIG. 19.

Referring to FIGS. 19 and 20, each of the pixel units 2 includes a first vertical LED chip 200, a second vertical LED chip 300, a third vertical LED chip 400, and a common electrode 600 mounted on the mount substrate 100. Bottom electrodes of the first vertical LED chip 200, the second vertical LED chip 300, and the third vertical LED chip 400 are connected to wires (not illustrated) of the mount substrate 100 so that the first, second, and third vertical LED chips can be individually driven. The bottom portion of the conductor 600 is grounded to the mount substrate 100. The mount substrate 100 may be a thin film transistor (TFT) substrate or a printed circuit board (PCB). The upper surface of each of the first vertical LED chip 200, the second vertical LED chip 300, the third vertical LED chip 400, and the conductor 600 has a width of 100 μm or less, most preferably 30 to 70 μm.

Each of the pixel units 2 includes a patterned wiring layer 700 electrically connecting the top portions of the first vertical LED chip 200, the second vertical LED chip 300, the third vertical LED chip 400, and the common electrode 600. Each of the pixel units 2 includes a support layer 800 formed in contact with the side surfaces of the first vertical LED chip 200, the second vertical LED chip 300, the third vertical LED chip 400, and the common electrode 600 to support the patterned wiring layer 700.

The first vertical LED chip 200, the second vertical LED chip 300, and the third vertical LED chip 400 are blue, green, and red LED chips, respectively, and each has a cubic or cuboidal shape. Each of the first vertical LED chip 200, the second vertical LED chip 300, and the third vertical LED chip 400 includes a first conductive semiconductor layer, a second conductive semiconductor layer, and an active layer interposed therebetween. The first vertical LED chip 200, the second vertical LED chip 300, the third vertical LED chip 400, and the common electrode 600 are arranged in a substantially square array.

A first connection area 201, a second connection area 301, a third connection area 401, and a fourth connection area 601 to which the patterned wiring layer 700 is connected are formed on the upper surfaces of the first vertical LED chip 200, the second vertical LED chip 300, the third vertical LED chip 400, and the common electrode 600, respectively. The first connection area 201, the second connection area 301, the third connection area 401, and the fourth connection area 601 are located at the corners closest to each other on the upper surfaces of the first vertical LED chip 200, the second vertical LED chip 300, the third vertical LED chip 400, and the common electrode 600, respectively.

Top electrodes of the first vertical LED chip 200, the second vertical LED chip 300, and the third vertical LED chip 400 may be provided in the first connection area 201, the second connection area 301, and the third connection area 401, respectively. The top electrodes may be disposed before formation of the patterned wiring layer 700 or may be formed as portions of the patterned wiring layer 700.

Bottom electrodes of the first vertical LED chip 200, the second vertical LED chip 300, and the third vertical LED chip 400 are individually connected to wires of the mount substrate 100 so that the first vertical LED chip 200, the second vertical LED chip 300, and the third vertical LED chip 400 can be individually driven.

An insulating resin material, such as epoxy, silicone, epoxy molding compound (EMC) or polyimide, is used to form the support layer 800 that is in contact with the side surfaces of the first vertical LED chip 200, the second vertical LED chip 300, the third vertical LED chip 400, and the common electrode 600. The use of the insulating resin material enables integration of the support layer 800 with the first vertical LED chip 200, the second vertical LED chip 300, the third vertical LED chip 400, and the common electrode 600. The support layer 800 plays a role in supporting the overlying patterned wiring layer 700, enabling the formation of the patterned wiring layer 700. Another role of the support layer 800 is to fixedly hold the first vertical LED chip 200, the second vertical LED chip 300, the third vertical LED chip 400, and the common electrode 600. The support layer 800 may be formed using a light-absorbing material, such as a black color material, or a light-reflecting material. In this case, the support layer 800 serves to prevent undesired interference of light emitted from the first vertical LED chip 200, the second vertical LED chip 300, and the third vertical LED chip 400.

It is preferred that the upper surface of the support layer 800 lies at the same level as the upper surfaces of the first vertical LED chip 200, the second vertical LED chip 300, and the third vertical LED chip 400. Here, the upper surfaces of the first vertical LED chip 200, the second vertical LED chip 300, and the third vertical LED chip 400 may be the upper surfaces of the epistructures or the upper surfaces of the top electrodes formed on the upper surfaces of the epistructures.

The patterned wiring layer 700 is supported by the underlying support layer 800 and connects the first vertical LED chip 200, the second vertical LED chip 300, the third vertical LED chip 400, and the common electrode 600. The patterned wiring layer 700 is connected to only some of the corner areas of the first vertical LED chip 200, the second vertical LED chip 300, the third vertical LED chip 400, and the common electrode 600. Specifically, the patterned wiring layer 700 is connected to the first connection area 201, the second connection area 301, the third connection area 401, and the fourth connection area 601. This limited connection minimizes masking of the upper surfaces of the first vertical LED chip 200, the second vertical LED chip 300, and the third vertical LED chip 400 by the patterned wiring layer 700.

In this embodiment, the patterned wiring layer 700 is in a substantially angled "C" shape and consists of a first straight wiring 201 connecting the first connection area 201 of the first vertical LED chip 200 to the second connection area 301 of the second vertical LED chip 300, a second straight wiring 702 connected to one end of the first wiring 701 in the second connection area 301 of the second vertical LED chip 300 and connecting the second connection area 301 to the third connection area 401 of the third vertical LED chip 400, and a third straight wiring 703 connected to one end of the second wiring 702 in the third connection area 401 of the third vertical LED chip 400 and connecting the third connection area 401 to the fourth connection area 601 of the common electrode 600.

The support layer 800 completely covers the side surfaces of the first vertical LED chip 200, the second vertical LED chip 300, and the third vertical LED chip 400. The upper surface of the support layer 800 is preferably flat and lies at the same level as the upper surfaces of the first vertical LED chip 200, the second vertical LED chip 300, and the third vertical LED chip 400. The bottom surface of the support layer 800 is grooved between the neighboring vertical LED chips or between the common electrode and the neighboring vertical LED chips.

Embodiment B-2

Figure 21:
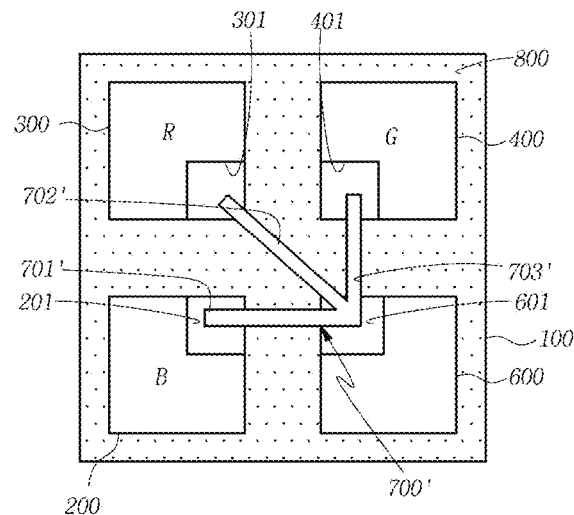
FIGS. 21 and 22 are views explaining micro-LED modules according to Embodiments B-2 and B-3.

FIG. 21 illustrates Embodiment B-2. Referring to FIG. 21, a patterned wiring layer 700' includes a first wiring 701' connecting the fourth connection area 601 of the common electrode 600 to the first connection area 201 of the first vertical LED chip 200, a second wiring 702' connecting the fourth connection area 601 of the common electrode 600 to the second connection area 301 of the second vertical LED chip 300, and a third wiring 703' connecting the fourth connection area 601 of the common electrode 600 to the third connection area 401 of the third vertical LED chip 400. The first wiring 701', the second wiring 702', and the third wiring 703' are connected to one another in the fourth connection area 601. Also in this embodiment, the wiring layer 700' is in contact with and supported by an underlying support layer 800.

Embodiment B-3

Figure 22:
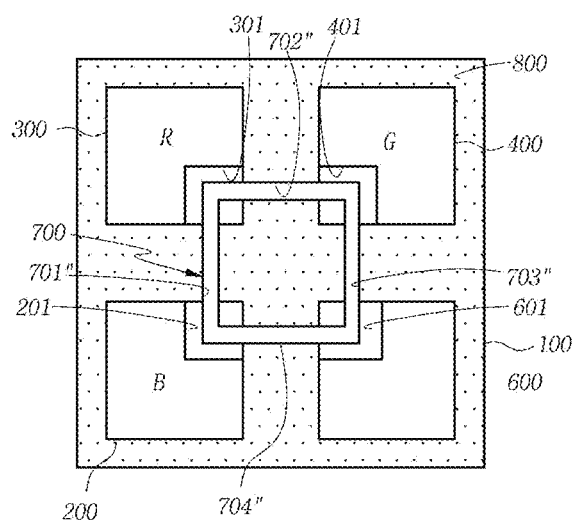

FIG. 22 illustrates Embodiment B-3. Referring to FIG. 22, a patterned wiring layer 700" has a substantially square shape and includes a first straight wiring 701" connecting the first connection area 201 of the first vertical LED chip 200 to the second connection area 301 of the second vertical LED chip 300, a second straight wiring 702" connected to one end of the first wiring 701" in the second connection area 301 of the second vertical LED chip 300 and connecting the second connection area 301 to the third connection area 401 of the third vertical LED chip 400, a third straight wiring 703" connected to one end of the second wiring 702" in the third connection area 401 of the third vertical LED chip 400 and connecting the third connection area 401 to the fourth connection area 601 of the common electrode 600, and a fourth straight wiring 704" connected to one end of the third wiring 703" in the fourth connection area 601 and connecting the fourth connection area 601 to the first connection area 201.

As illustrated in FIG. 19, 21 or 22, the patterned wiring layer 700, 700' or 700" is connected to the corner areas of the first vertical LED chip 200, the second vertical LED chip 300, the third vertical LED chip 400, and the common electrode 600 without masking areas other than the corners of the first vertical LED chip 200, the second vertical LED chip 300, the third vertical LED chip 400, achieving higher luminous efficiency.

Embodiment B-4

Referring now to FIGS. 23 to 29, a description will be given regarding a method for fabricating a micro-LED module according to Embodiment A-4.

Figure 2:
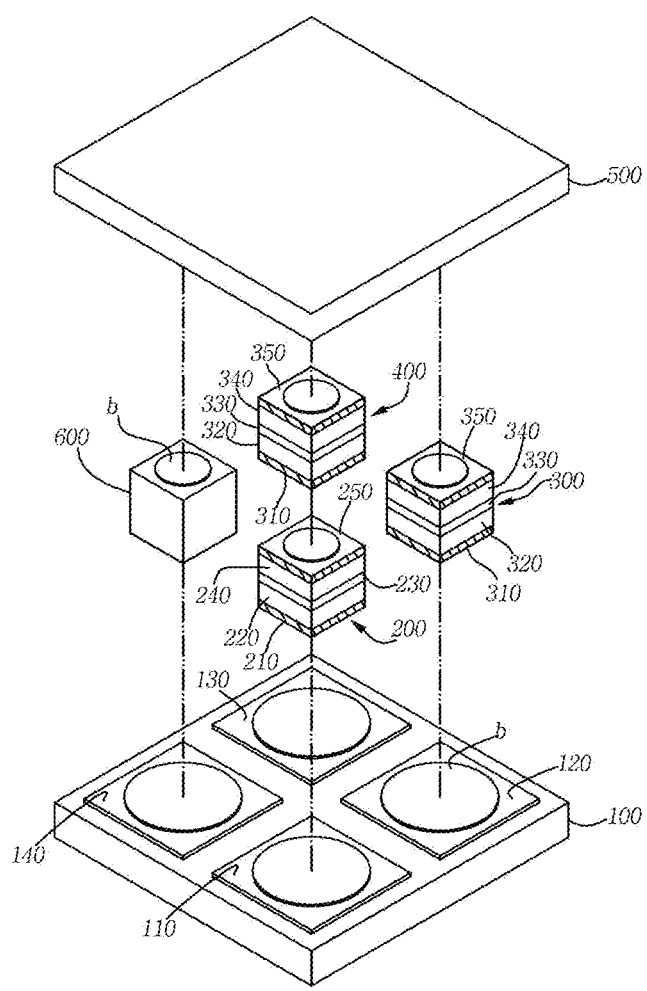
FIG. 2 is an exploded perspective view illustrating the light emitting element according to Embodiment A-1.
Figure 3:
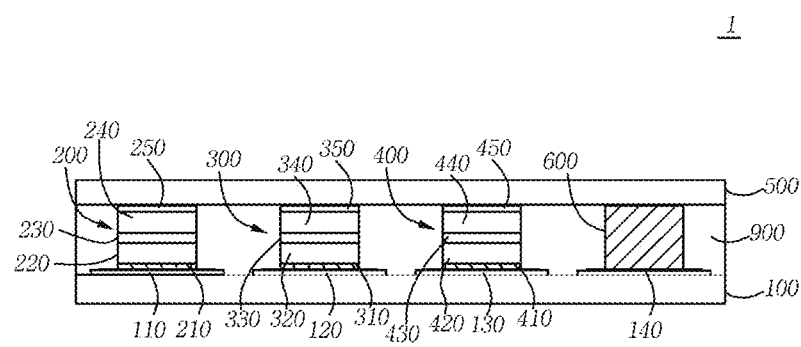
FIG. 3 is a cross-sectional view taken along line I-I of FIG. 1b.

For convenience of illustration and explanation, first, second, and third vertical LED chips and a common electrode are arrayed in a row. However, it is noted that the vertical LED chips and the common electrode are indeed arranged in a quadrangular array, as illustrated in FIG. 2.

Figure 23:
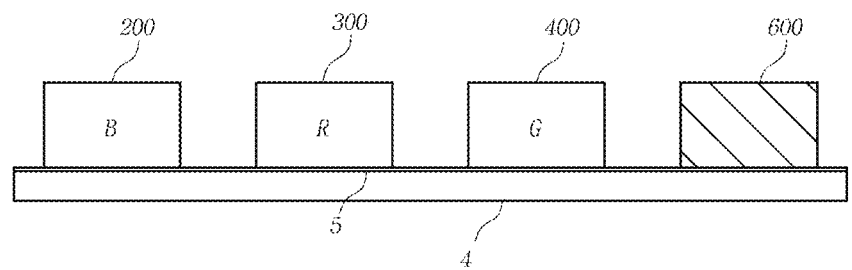
FIGS. 23 to 29 are view explaining a method for fabricating a micro-LED module according to Embodiment B-4.

Referring first to FIG. 23, a first vertical LED chip 200, a second vertical LED chip 300, a third vertical LED chip 400, and a common electrode 600 are attached to a support substrate 4 with an adhesive layer 5. The array of the vertical LED chips and the common electrode may be the same as that illustrated in FIG. 2. The top portions of the first vertical LED chip 200, the second vertical LED chip 300, and the third vertical LED chip 400 from which light is emitted are directed downward and are bonded to the support substrate 4, as illustrated in FIG. 23.

Figure 24:
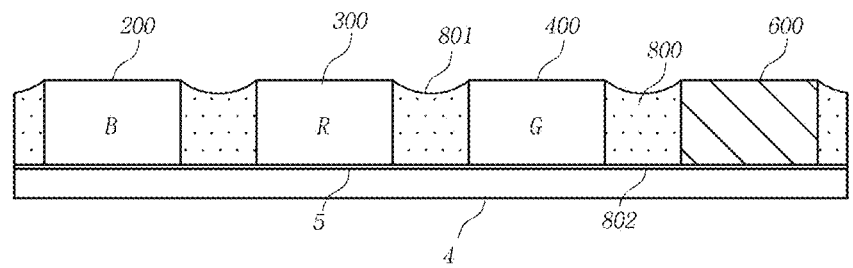

Referring next to FIG. 24, a support layer 800 is formed by filling a light-blocking insulating resin material, such as epoxy, silicone, epoxy molding compound (EMC) or polyimide, in a space defined by the first vertical LED chip 200, the second vertical LED chip 300, the third vertical LED chip 400, and the common electrode 600 bonded to the support substrate 4. The liquid light-blocking insulating resin material is used in such an amount that it completely covers the side surfaces of the first vertical LED chip 200, the second vertical LED chip 300, the third vertical LED chip 400, and the common electrode 600 but does not overflow. Then, the light-blocking insulating resin material is hardened. Grooves 801 are formed on the surface of the support layer 8 opposite to the support substrate 4 due to the high contact strength of the liquid light-blocking insulating resin material with the side surfaces of the vertical LED chips. In contrast, the surface 802 of the support layer in contact with the support substrate 4 is flat.

Figure 25:
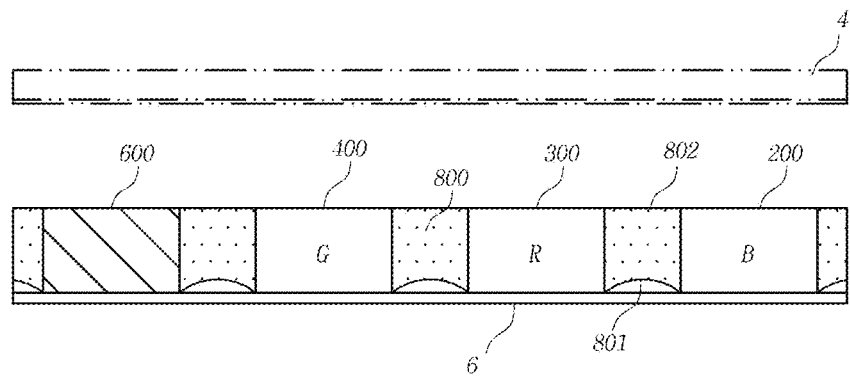

Referring next to FIG. 25, the support substrate 4 attached with the first vertical LED chip 200, the second vertical LED chip 300, the third vertical LED chip 400, and the common electrode 600 and integrated with the support layer 800 is inverted and is separated from the first vertical LED chip 200, the second vertical LED chip 300, the third vertical LED chip 400, the common electrode 600, and the support layer 800. The flat surface 802 of the support layer 800 lies in the same level as the upper surfaces of the first vertical LED chip 200, the second vertical LED chip 300, the third vertical LED chip 400, and the common electrode 600. A chip retaining sheet 6 may be temporarily attached to the grooved surface of the support layer 800 and the lower surfaces of the first vertical LED chip 200, the second vertical LED chip 300, the third vertical LED chip 400, and the common electrode 600.

Figure 26:
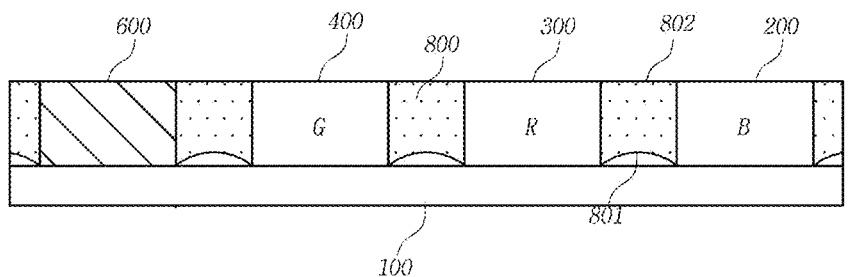

Referring next to FIG. 26, after removal of the chip retaining sheet 6, the first vertical LED chip 200, the second vertical LED chip 300, and the third vertical LED chip 400 are mounted such that their bottom portions are in contact with the upper surface of the mount substrate 100. Here, bottom electrodes of the first vertical LED chip 200, the second vertical LED chip 300, and the third vertical LED chip 400 are individually bonded to wires of the mount substrate 100. As a result, a structure is prepared in which the first vertical LED chip 200, the second vertical LED chip 300, and the third vertical LED chip 400 are mounted on the mount substrate, the common electrode 600 is arranged on the mount substrate 100, and the support layer 800 is formed in contact with the side surfaces of the first vertical LED chip 200, the second vertical LED chip 300, the third vertical LED chip 400, and the common electrode 600.

Figure 27:
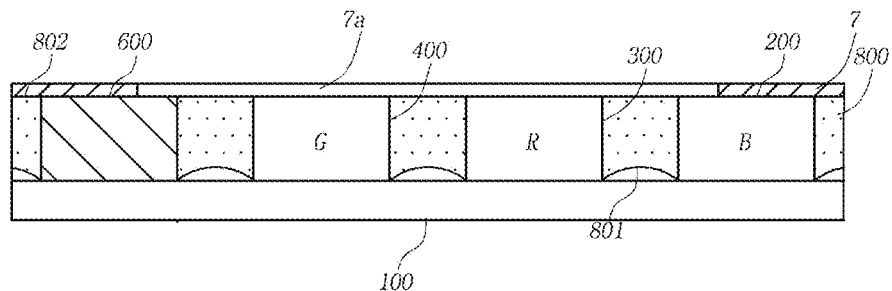

Referring next to FIG. 27, a mask 7 is formed over the flat upper surface of the support layer 800 and the top portions of the first vertical LED chip 200, the second vertical LED chip 300, the third vertical LED chip 400, and the common electrode 600 lying in the same level as the upper surface of the support layer 800. For example, the mask has a patterned hole 7a in a substantially angled "C" shape corresponding to the shape of the patterned wiring layer illustrated in FIG. 19. For example, the patterned hole 7a of the mask 7 may be formed by exposure through a PR.

Figure 28:
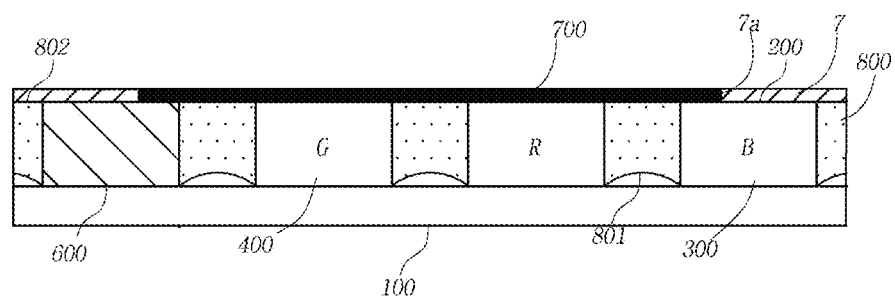

Referring next to FIG. 28, a patterned wiring layer 700 connects the top portion (top electrode) of the first vertical LED chip 200, the top portion (top electrode) of the second vertical LED chip 300, the top portion (top electrode) of the third vertical LED chip 400, and the top portion of the support layer 800. The patterned wiring layer 700 is formed by sputtering/deposition through the patterned hole 7a. The patterned wiring layer 700 is supported by the underlying support layer 800.

Figure 29:
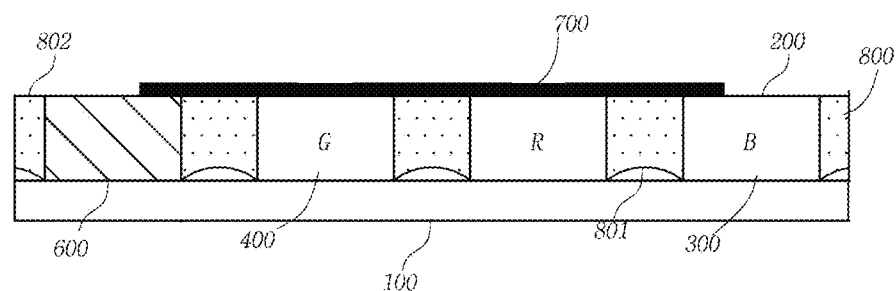

Referring next to FIG. 29, the mask 7 is removed, and as a result, a micro-LED module is fabricated in which the patterned wiring layer 700 is supported by the electrically insulating support layer 800 and electrically connects the top portions (top electrodes) of the first, second, and third vertical LED chips 200, 300, and 400 and the common electrode 600. In the micro-LED module, the bottom portions (bottom electrodes) of the first, second, and third vertical LED chips 200, 300, and 400 are individually connected to wires of the mount substrate 100 and are connected in common to the common electrode 600 grounded to the mount substrate 100. With these connections, the first, second, and third vertical LED chips 200, 300, and 400 can be individually driven.

Embodiments C

Embodiment C-1

Figure 30:
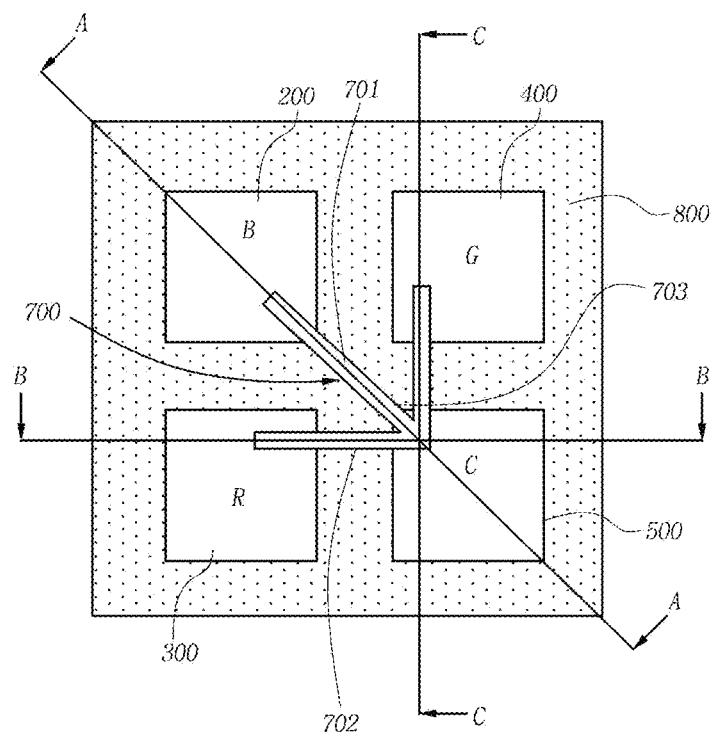
FIG. 30 is a plan view illustrating a micro-LED module according to Embodiment C-1.
Figure 31:
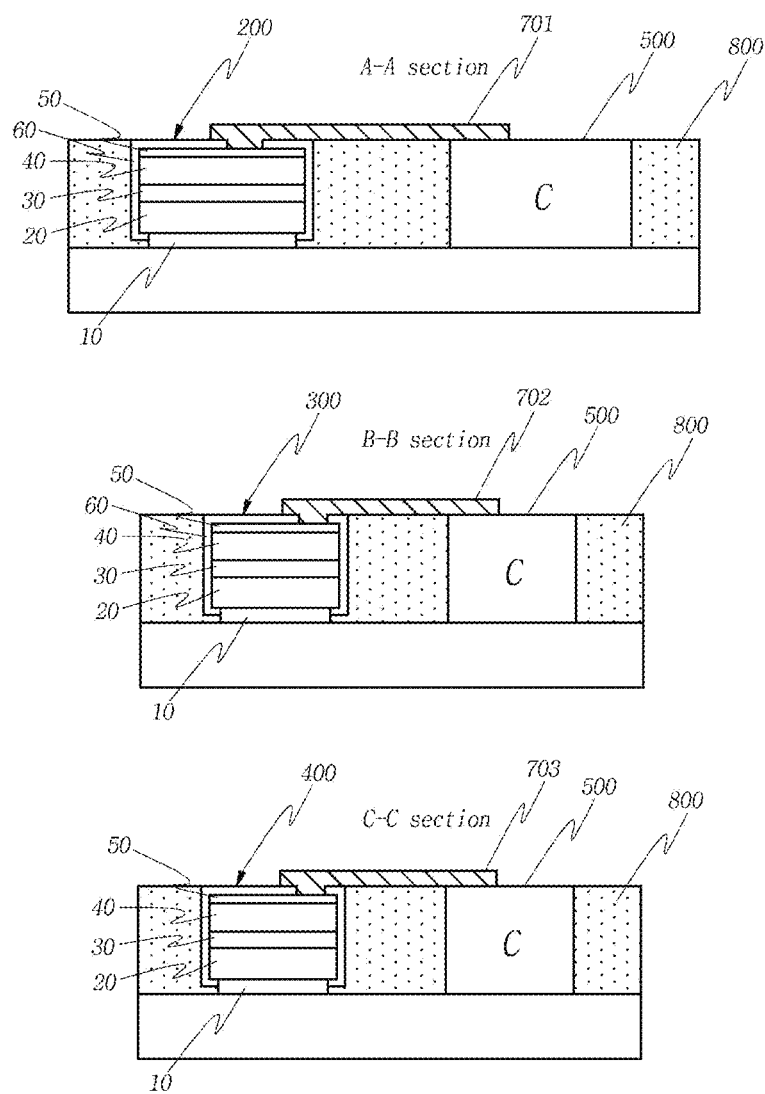
FIG. 31 illustrates cross-sectional view taken along lines A-A, B-B, and C-C of FIG. 30.

Referring to FIGS. 30 and 31, a micro-LED module 1000 according to Embodiment C-1 includes a rectangular or square mount substrate 100 and one or more pixel units 2 arranged on the mount substrate 100. One pixel unit 2 may be arranged on the mount substrate 100 or a plurality of pixel units 2 may be arranged in a matrix on the mount substrate 100. The plurality of pixel units 2 arranged in a matrix are arrayed along a virtual straight line in the horizontal or vertical direction.

Each of the pixel units 2 mounted on the mount substrate 100 includes a first vertical LED chip 200 emitting blue light, a second vertical LED chip 300 emitting red light, a third vertical LED chip 400 emitting green light, and a common electrode 500. In this embodiment, only three vertical LED chips 200, 300, and 400 are provided but a larger number of vertical LED chips may also be provided in the pixel unit 2.

Here, it is noted that the first vertical LED chip 200, the second vertical LED chip 300, and the third vertical LED chip 400 may be arranged in any order.

Each of the first vertical LED chip 200, the second vertical LED chip 300, and the third vertical LED chip 400 has a width of 100 µm or less, most preferably 30 to 70 µm. The mount substrate 100 may be a thin film transistor (TFT) substrate or a printed circuit board (PCB).

Each of the first vertical LED chip 200, the second vertical LED chip 300, and the third vertical LED chip 400 includes a first conductive semiconductor layer 20, an active layer 30, and a second conductive semiconductor layer 40. Each of the first vertical LED chip 200, the second vertical LED chip 300, and the third vertical LED chip 400 may further include a top electrode 50 disposed on the upper surface of the second conductive semiconductor layer. The top electrode 50 may be a light-transmitting transparent electrode layer or a metal electrode covering only a portion of the second conductive semiconductor layer 40. Each of the first vertical LED chip 200, the second vertical LED chip 300, and the third vertical LED chip 400 may further include a bottom electrode 10. The bottom electrodes 10 are individually connected to wires of the mount substrate 100. Here, the bottom electrodes 10 are preferably reflective electrodes. The bottom electrodes 10 are individually disposed in the bottom portions of the vertical LED chips 200, 300 and 400 and function as input electrodes. The top electrodes 50 are individually disposed in the top portions of the vertical LED chips 200, 300 and 400 and function as output electrodes.

Each of the first vertical LED chip 200, the second vertical LED chip 300, and the third vertical LED chip 400 further includes a shield 60 covering portions (particularly, the side surfaces of the semiconductor layers) other than a portion of the upper surface of the top electrode 50 and a portion of the lower surface of the bottom electrode 10. The shields 60 may be electrically insulating passivation layers.

The micro-LED module 1000 includes a support part 800 covering the side surfaces of the first vertical LED chip 200, the second vertical LED chip 300, and the third vertical LED chip 400 and having openings through which the upper surfaces of the first vertical LED chip 200, the second vertical LED chip 300, and the third vertical LED chip 400 are exposed. The micro-LED module 1000 includes a patterned wiring layer 700 formed on the support part 800 to connect the upper surface of the common electrode 500 to the upper surfaces of the first vertical LED chip 200, the second vertical LED chip 300, and the third vertical LED chip 400. The upper surfaces of the first vertical LED chip 200, the second vertical LED chip 300, and the third vertical LED chip 400 are exposed through the openings of the support part 800.

The upper surfaces of the first vertical LED chip 200, the second vertical LED chip 300, and the third vertical LED chip 400 in direct contact with the patterned wiring layer 700 may be the surfaces of the top electrodes 50.

The support part 800 is preferably made of a light-absorbing material, such as a black matrix material, to prevent interference of light between the neighboring vertical LED chips. The support part 800 is preferably electrically insulating.

After mounting of the first vertical LED chip 200, the second vertical LED chip 300, the third vertical LED chip 400, and the common electrode 600 on the mount substrate, the support part 800 is formed on the mount substrate 100 to cover the side surfaces of the first vertical LED chip 200, the second vertical LED chip 300, and the third vertical LED chip 400.

Alternatively, after attachment of the lower surfaces of the first vertical LED chip 200, the second vertical LED chip 300, and the third vertical LED chip 400 to the surface of a sacrificial substrate (not illustrated) rather than to the surface of the mount substrate 100, the support part 800 may be formed on the sacrificial layer to cover the side surfaces of the first vertical LED chip 200, the second vertical LED chip 300, and the third vertical LED chip 400. In this case, the patterned wiring layer 700 is formed on the support part 800 to electrically connect in common the upper surfaces of the first vertical LED chip 200, the second vertical LED chip 300, and the third vertical LED chip 400, the sacrificial substrate is removed, and the first vertical LED chip 200, the second vertical LED chip 300, and the third vertical LED chip 400 integrated with the support part 800 are mounted on the mount substrate 100 such that the lower surfaces of the first vertical LED chip 200, the second vertical LED chip 300, and the third vertical LED chip 400 exposed after removal of the sacrificial substrate come into contact with the mount substrate 100.

The patterned wiring layer 700 starts from the upper surface of the common electrode 600, traverses the upper surface of the support part 800 through three paths, and is connected to the upper surfaces of the first vertical LED chip 200, the second vertical LED chip 300, and the third vertical LED chip 400.

The patterned wiring layer 700 consists of three linear wiring patterns diverging from the upper surface of the common electrode 600 such that it can minimally cover the upper surfaces of the first vertical LED chip 200, the second vertical LED chip 300, and the third vertical LED chip 400. More specifically, the patterned wiring layer 700 is supported by the upper end of the support part 800 and includes a linear first wiring 701 connecting the upper surface of the common electrode 600 to the upper surface of the first vertical LED chip 200, a second wiring 702 connecting the upper surface of the common electrode 600 to the upper surface of the second vertical LED chip 300, and a third wiring 703 connecting the upper surface of the common electrode 600 to the upper surface of the third vertical LED chip 400.

The patterned wiring layer 700 can be formed by depositing a metal on a mask covering the support part 800 and the first, second, and third vertical LED chips 200, 300, and 400 and having patterned holes through which the upper surfaces of the first, second, and third first vertical LED chips 200, 300, and 400 and the common electrode 600 are partially exposed. The metal can be deposited by a physical vapor deposition process such as sputtering or a chemical vapor deposition process. Alternatively, a light-transmitting conductive non-metallic material such as ITO may be deposited such that it meets the upper surfaces of the vertical LED chips 200, 300, and 400 and the common electrode 500.

In addition, the micro-LED module 1000 may further include an insulating material layer covering and protecting the patterned wiring layer 700. The insulating material layer is formed so as to cover at least the upper surface of the patterned wiring layer 700. When the insulating material layer is not light transmissive, its area is minimized such that the patterned wiring layer is covered as little as possible, as illustrated. Meanwhile, when the insulating material layer is light transmissive, it may be formed to completely cover the support part and the first, second, and third vertical LED chips 200, 300, and 400.

As mentioned briefly above, the support part 800 and the patterned wiring layer 700 can be sequentially formed after mounting of the first, second, and third vertical LED chips 200, 300, and 400 and the common electrode 500 on the mount substrate 100. Alternatively, the support part 800 and the patterned wiring layer 700 may be sequentially formed after mounting of the first, second, and third vertical LED chips 200, 300, and 400 and the common electrode 500 on a sacrificial substrate (not illustrated) rather than on the mount substrate 100.

The former case requires a process for forming the patterned wiring layer 700 connecting the first, second, and third vertical LED chips 200, 300, and 400 and the common electrode 500 on the support part 800 and a subsequent process for forming the insulating material layer 900. In contrast, the latter case further requires a process for removing the sacrificial substrate and a process for connecting the bottom electrode layers 10 of the first, second, and third vertical LED chips 200, 300, and 400 and the bottom portion of the common electrode 500 to wires of the mount substrate 100 after formation of the insulating material layer.

Embodiment C-2

Figure 32:
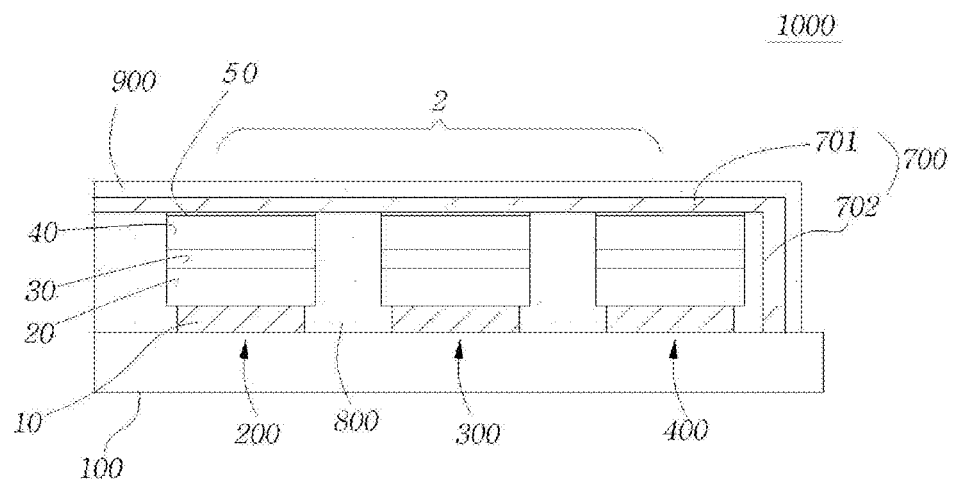
FIG. 32 is a cross-sectional view illustrating a micro-LED module according to Embodiment C-2.
Figure 33:
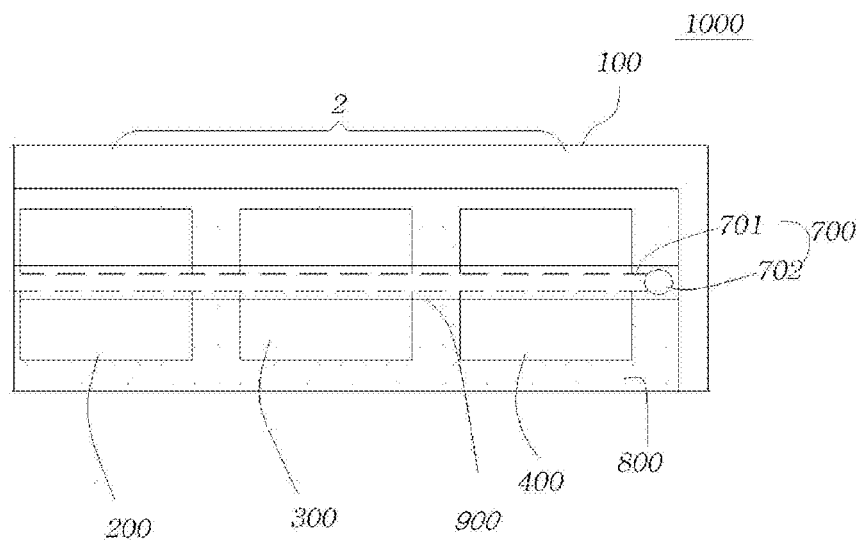
FIG. 33 is a plan view illustrating the micro-LED module according to Embodiment C-2.

Referring to FIGS. 32 and 33, a micro-LED module according to Embodiment C-2 includes a rectangular or square mount substrate 100 and at least one pixel unit 2 arranged on the mount substrate 100.

The pixel unit includes a first vertical LED chip 200 emitting blue light, a second vertical LED chip 300 emitting red light, and a third vertical LED chip 400 emitting green light mounted on the mount substrate 100. It is noted that the first vertical LED chip 200, the second vertical LED chip 300, and the third vertical LED chip 400 may be arranged in any order.

Each of the first vertical LED chip 200, the second vertical LED chip 300, and the third vertical LED chip 400 has a width of 100 μm or less, most preferably 30 to 70 μm. The mount substrate 100 may be a thin film transistor (TFT) substrate or a printed circuit board (PCB).

Each of the first vertical LED chip 200, the second vertical LED chip 300, and the third vertical LED chip 400 includes a first conductive semiconductor layer 20, an active layer 30, and a second conductive semiconductor layer 40. Each of the first vertical LED chip 200, the second vertical LED chip 300, and the third vertical LED chip 400 may further include a top electrode layer 50 formed on the upper surface of the second conductive semiconductor layer 40.

Each of the first vertical LED chip 200, the second vertical LED chip 300, and the third vertical LED chip 400 may further include a bottom electrode layer 10. The bottom electrode layers 10 are individually connected to wires of the mount substrate 100. The bottom electrode layers 10 are preferably reflective electrodes.

The micro-LED module 1000 includes an insulating support part 800 covering the side surfaces of the first vertical LED chip 200, the second vertical LED chip 300, and the third vertical LED chip 400 and having openings through which the upper surfaces of the first vertical LED chip 200, the second vertical LED chip 300, and the third vertical LED chip 400 are exposed. The micro-LED module 1000 includes a patterned wiring layer 700 formed on the insulating support part 800 and connected in common to the upper surfaces of the first vertical LED chip 200, the second vertical LED chip 300, and the third vertical LED chip 400 through the openings. The patterned wiring layer 700 functions as a common electrode.

In the previous embodiment, the support part is formed beyond the upper ends (i.e. the top electrodes) of the vertical LED chips to cover portions of the upper ends of the vertical LED chips. In contrast, in this embodiment, the support part 800 is located at the same height as the upper ends of the vertical LED chips.

The upper surfaces of the first vertical LED chip 200, the second vertical LED chip 300, and the third vertical LED chip 400 in direct contact with the patterned wiring layer 700 may be the surfaces of the second conductive semiconductor layers 40, the surfaces of the transparent electrode layers 50 formed on the second conductive semiconductor layers 40 or the surfaces of the metal electrodes (not illustrated) formed on the second conductive semiconductor layers 40 or the transparent electrode layers 50.

The insulating support part 800 is preferably made of a light-absorbing material, such as a black matrix material, to prevent interference of light between the neighboring vertical LED chips. The support part 800 is preferably electrically insulating.

After mounting of the first vertical LED chip 200, the second vertical LED chip 300, the third vertical LED chip 400, and the common electrode 600 on the mount substrate 100, the insulating support part 800 is formed on the mount substrate 100 to cover the side surfaces of the first vertical LED chip 200, the second vertical LED chip 300, and the third vertical LED chip 400.

Alternatively, after attachment of the lower surfaces of the first vertical LED chip 200, the second vertical LED chip 300, and the third vertical LED chip 400 to the surface of a sacrificial substrate (not illustrated) rather than to the surface of the mount substrate 100, the insulating support part 800 may be formed on the sacrificial layer to cover the side surfaces of the first vertical LED chip 200, the second vertical LED chip 300, and the third vertical LED chip 400. In this case, the patterned wiring layer 700 is formed on the insulating support part 800 to electrically connect in common the upper surfaces of the first vertical LED chip 200, the second vertical LED chip 300, and the third vertical LED chip 400, the sacrificial substrate is removed, and the first vertical LED chip 200, the second vertical LED chip 300, and the third vertical LED chip 400 integrated with the insulating support part 800 are mounted on the mount substrate 100 such that the lower surfaces of the first vertical LED chip 200, the second vertical LED chip 300, and the third vertical LED chip 400 exposed after removal of the sacrificial substrate come into contact with the mount substrate 100.

The patterned wiring layer 700 traverses the upper surface of the insulating support part 800 and the upper surfaces of the first vertical LED chip 200, the second vertical LED chip 300, and the third vertical LED chip 400. Here, the patterned wiring layer 700 has a linear shape with a narrow width to minimally cover the upper surfaces of the first vertical LED chip 200, the second vertical LED chip 300, and the third vertical LED chip 400.

The patterned wiring layer 700 is supported by the upper surface of the insulating support part 800 and includes a first wiring 701 connecting the upper surfaces of the first vertical LED chip 200, the second vertical LED chip 300, and the third vertical LED chip 400 and a second wiring 702 connected to the first wiring 701, extending along the side surface of the insulating support part 800, and connected and grounded to the mount substrate 100. The first wiring 701 is integrated with the second wiring 702.

At least a portion of the patterned wiring layer 700 can be formed by depositing a metal on a mask covering the upper surfaces of the insulating support part 800 and the first, second, and third vertical LED chips 200, 300, and 400 and having patterned holes through which the first, second, and third vertical LED chips 200, 300, and 400 are partially exposed.

In this embodiment, the first wiring 701 not only connects the first, second, and thirds 200, 300, and 400 in the pixel unit, but also connects the vertical LED chips of the adjacent pixel units. Accordingly, in this embodiment, one second wiring 702 can be connected in common to the vertical LED chips of several pixel units. Alternatively, one first wiring 701 and one second wiring 702 may be provided in each pixel unit. In this case, the second wiring 702 is formed so as to penetrate the insulating support part 800.

In addition, the micro-LED module 1000 may further include an insulating material layer 900 covering and protecting the patterned wiring layer 700. The insulating material layer 900 is formed so as to cover at least the upper surface of the patterned wiring layer 700. When the insulating material layer 900 is not light transmissive, its area is minimized such that the patterned wiring layer 700 is covered as little as possible, as illustrated. Meanwhile, when the insulating material layer is light transmissive, it may be formed to completely cover the support part and the first, second, and third vertical LED chips 200, 300, and 400.

As mentioned briefly above, the support part 800 and the patterned wiring layer 700 can be sequentially formed after mounting of the first, second, and third vertical LED chips 200, 300, and 400 on the mount substrate 100. Alternatively, the support part 800 and the patterned wiring layer 700 may be sequentially formed after mounting of the first, second, and third vertical LED chips 200, 300, and 400 on a sacrificial substrate (not illustrated) rather than on the mount substrate 100.

The former case requires a process for forming the patterned wiring layer 700 connecting the first, second, and third vertical LED chips 200, 300, and 400 and connecting one of the first, second, and third vertical LED chips 200, 300, and 400 to the mount substrate 100 on the insulating support part 800 and a subsequent process for forming the insulating material layer 900. In contrast, the latter case further requires a process for removing the sacrificial substrate and a process for connecting the bottom electrodes of the first, second, and third vertical LED chips 200, 300, and 400 and the lower end of the second wiring 702 of the patterned wiring layer 700 to wires of the mount substrate 100 after formation of the patterned wiring layer 700 connecting the first, second, and third vertical LED chips 200, 300, and 400 and connecting one of the first, second, and third vertical LED chips 200, 300, and 400 to the sacrificial substrate on the insulating support part 800 and subsequent formation of the insulating material layer.

Embodiment C-3

Figure 34:
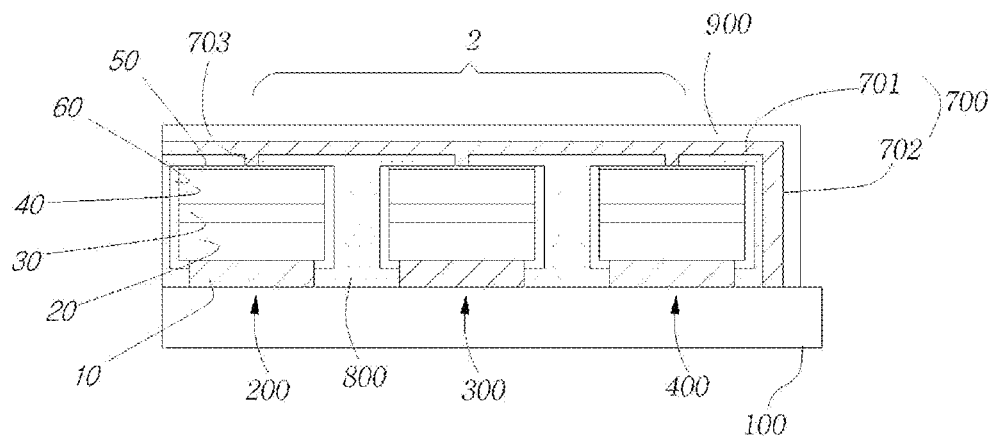
FIG. 34 is a cross-sectional view illustrating a micro-LED module according to Embodiment C-3.
Figure 35:
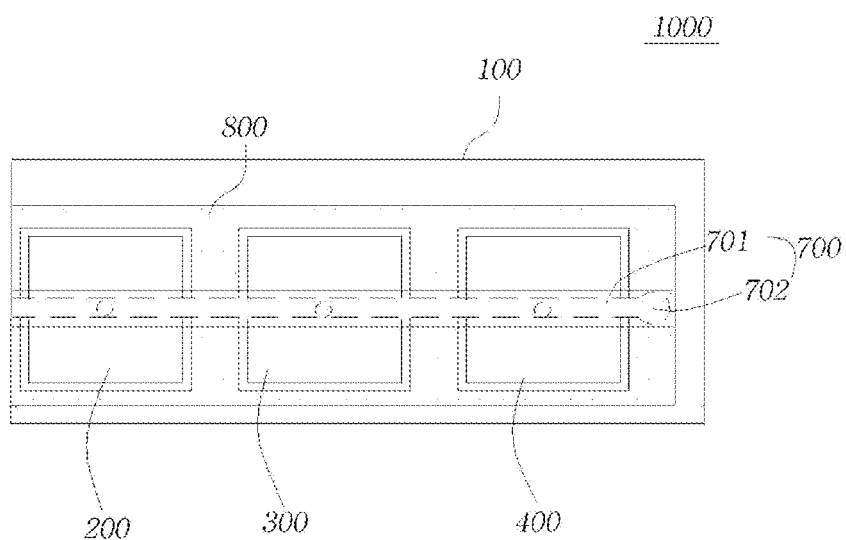
FIG. 35 is a plan view illustrating the micro-LED module according to Embodiment C-3.

FIGS. 34 and 35 illustrate a micro-LED module according to Embodiment C-3.

Referring to FIGS. 34 and 35, each of the first vertical LED chip 200, the second vertical LED chip 300, and the third vertical LED chip 400 includes a shield 60. The shield 60 covers the side surfaces of the first conductive semiconductor layer 20, the active layer 30, and the second conductive semiconductor layer 40 of each of the first vertical LED chip 200, the second vertical LED chip 300, and the third vertical LED chip 400. The shield 60 may be formed using a light-reflecting or light-absorbing material. The shield 60 is most preferably a distributed Bragg reflector (DBR) or a reflector such as a metal reflector. It is noted that the construction of the shield 60 described in Embodiment C-1 also applies to this embodiment.

In this embodiment, light interference is prevented by the formation of the shields 60 in the first vertical LED chip 200, the second vertical LED chip 300, and the third vertical LED chip 400. The insulating support part 800 may be made of a light-transmitting material, unlike in Embodiment C-2. In this case, the insulating support part 800 covers the upper surfaces of the first vertical LED chip 200, the second vertical LED chip 300, and the third vertical LED chip 400 and has openings through which only portions of the upper surfaces of the first vertical LED chip 200, the second vertical LED chip 300, and the third vertical LED chip 400 are exposed. The patterned wiring layer 700 includes connection protrusions 703 connected to the upper surfaces of the first vertical LED chip 200, the second vertical LED chip 300, and the third vertical LED chip 400.

Embodiment C-4

Figure 36:
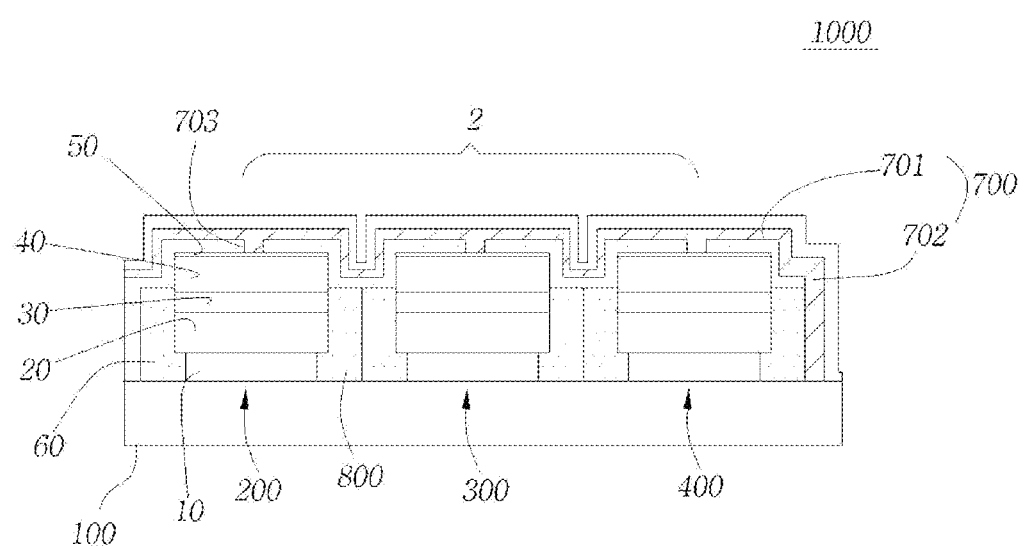
FIG. 36 is a cross-sectional view illustrating a micro-LED module according to Embodiment C-4.

FIG. 36 illustrates a micro-LED module according to Embodiment C-4.

Referring to FIG. 36, the insulating support part 800, the patterned wiring layer 700, and the insulating material layer 900 are sequentially formed along the outer profiles of the first, second, and third vertical LED chips 200, 300, and 400, each of which is provided with the shield 60 on the side surface thereof, by a step cover process. The insulating support part 800 and the insulating material layer 900 may be passivation layers formed by deposition of a light-transmitting insulating material, preferably SiO$_2$. First, the insulating support part 800 is formed. The insulating support part 800 has openings through which the upper surfaces of the first, second, and third vertical LED chips 200, 300, and 400 are exposed. A metal is deposited on the surface of the insulating support part 800 having the openings to form the patterned wiring layer 700, which are connected to the upper surfaces of the first, second, and third vertical LED chips 200, 300, and 400 or the electrodes disposed on the upper surfaces of the vertical LED chips. As in the previous embodiment, the patterned wiring layer 700 includes a first wiring 701 extending along the upper surface of the insulating support part 800 and connected in common to the upper surfaces of the first, second, and third vertical LED chips 200, 300, and 400 and a second wiring 702 connected to the first wiring 701, extending along the side surface of the insulating support part 800, and connected to the mount substrate 100. Then, the insulating material layer 900 covering the patterned wiring layer 700 is formed. The adjacent shields 60 of the adjacent vertical LED chips 200 and 300 or 300 and 400 may be in contact with each other. In this case, the shields 60, in part, function as support parts.

Embodiments D

Figure 37:
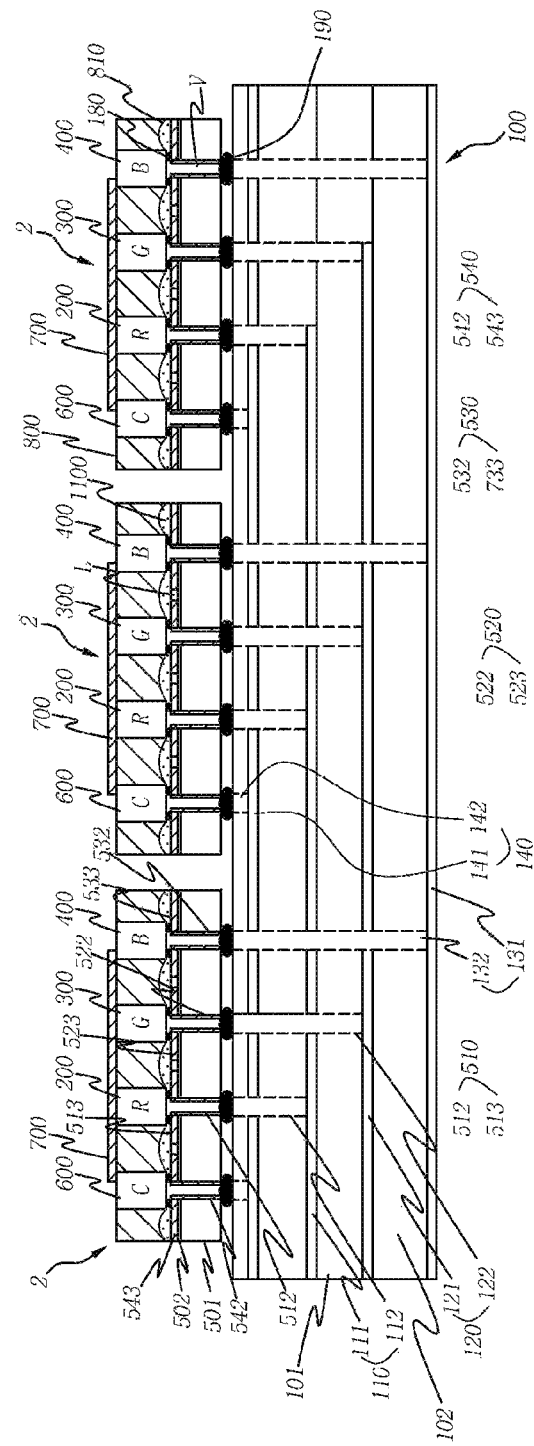
FIG. 37 is a cross-sectional view of an LED display panel according to Embodiment D in which vertical LED chips and common electrodes are arrayed in a row for convenience of illustration.

FIG. 37 is a cross-sectional view illustrating a display panel according to Embodiment D. For convenience of illustration, vertical LED chips and common electrode are arranged in a row.

Referring to FIG. 37, the LED display panel includes a plurality of LED pixel units 2 and a mount substrate 100 on which the LED pixel units 2 are arranged. The mount substrate 100 is rectangular or square in shape and the plurality of LED pixel units 2 are arrayed in a matrix on the mount substrate 100.

Each of the plurality of LED pixel units 2 includes a first vertical LED chip 200 emitting red light, a second vertical LED chip 300 emitting green light, and a third vertical LED chip 400 emitting blue light when a current is applied. Each of the plurality of LED pixel units 2 includes a common electrode 600 connected in common to top electrodes of the first vertical LED chip 200, the second vertical LED chip 300, and the third vertical LED chip 400.

Each of the plurality of LED pixel units 2 includes a first connection part 510, a second connection part 520, and a third connection part 530 connected to the top electrodes of the first vertical LED chips 200, the second vertical LED chip 300, and the third vertical LED chip 400, respectively, and a fourth connection part 540 connected to the bottom portion of the common electrode 600.

Although not specifically illustrated in FIG. 37, the top electrodes are located at the upper ends of the first vertical LED chips 200, the second vertical LED chips 300, and the third vertical LED chips 400, and the bottom electrodes are located at the lower ends of the first vertical LED chips 200, the second vertical LED chips 300, and the third vertical LED chips 400. The top electrodes and the bottom electrodes have opposite electrical polarities.

The first connection part 510, the second connection part 520, the third connection part 530, and the fourth connection part 540 are formed so as to penetrate a support substrate 501 by which the first vertical LED chip 200, the second vertical LED chip 300, the third vertical LED chip 400, and the common electrode 600 are supported.

The first connection part 510, the second connection part 520, the third connection part 530, and the fourth connection part 540 include a first via 512, a second via 522, a third via 532, and a fourth via 542 filled in a first via hole, a second via hole, a third via hole, and a fourth via hole penetrating the support substrate 501, respectively. The support substrate 501 is an electrically insulating substrate such as a glass or silicone substrate. The first via 512, the second via 522, the third via 532, and the fourth via 542 may be formed by depositing a metal material, preferably Au, into the first via hole, the second via hole, the third via hole, and the fourth via hole, respectively. The amount of the metal material deposited is controlled such that the first via 512, the second via 522, the third via 532, and the fourth via 542 have cavities V. Solders are filled in the cavities V to ensure more stable bonding, which will be explained below.

The first connection part 510, the second connection part 520, the third connection part 530, and the fourth connection part 540 further include a first electrode film 513, a second electrode film 523, a third electrode film 533, and a fourth electrode film 543 formed on the support substrate 501, respectively. The first electrode film 513, the second electrode film 523, the third electrode film 533, and the fourth electrode film 543 are separated from one another and are in contact with the top portions of the first via 512, the second via 522, the third via 532, and the fourth via 542, respectively.

Each of the LED pixel units 2 further includes an electrically insulating support layer 800 formed in contact with the side surfaces of the first vertical LED chip 200, the second vertical LED chip 300, the third vertical LED chip 400, and the common electrode 600. The top electrodes of the first vertical LED chip 200, the second vertical LED chip 300, and the third vertical LED chip 400 are connected to the upper surface of the common electrode 600 through a patterned wiring layer 700 supported by the support layer 800.

The support layer 800 has a flat upper surface supporting the patterned wiring layer 700 and a low surface having grooves 810 formed between the first vertical LED chip 200 and the second vertical LED chip 300, between the second vertical LED chip 300 and the third vertical LED chip 400, and between the first 200 or third vertical LED chip 400 and the common electrode 600.

The support layer 800 is packaged integrally with the first vertical LED chip 200, the second vertical LED chip 300, the third vertical LED chip 400, and the common electrode 600 before being arranged on the mount substrate. The support layer 800 is formed using a resin material containing a light-absorbing or light-reflecting material. The bottom surface of the support layer 800 is grooved whereas the upper surface of the support layer 800 and the upper surfaces of the first vertical LED chip 200, the second vertical LED chip 300, the third vertical LED chip 400, and the common electrode 600 are preferably coplanar. An underfill layer 1100 is formed by filling a resin material between the support substrate 501 and the support layer 800 to ensure reliable bonding to the support substrate 501 and protect the vertical LED chips.

The first electrode film 513 is connected to the bottom electrode of the first vertical LED chip 200, the second electrode film 523 is connected to the bottom electrode of the second vertical LED chip 300, the third electrode film 533 is connected to the bottom electrode of the third vertical LED chip 400, and the fourth electrode film 543 is connected to the bottom portion of the common electrode 600 through bump balls 180. The bump balls 180 are formed along the peripheries of the first via 512, the second via 522, the third via 532, and the fourth via 542. That is to say, the plurality of bump balls 180 are preferably arranged at regular intervals while maintaining distances from the center of one via 512, 522 or 532. The number of the bump balls 180 with respect to each via is preferably at least three.

The first electrode film 513, the second electrode film 523, the third electrode film 533, and the fourth electrode film 543 are delimited by electrode separation lines L, which are formed by etching the metal layer laminated on the support substrate 501. The metal layer may be a copper foil bonded to the support substrate 501 using an adhesive, more specifically a UV-curable adhesive 502.

According to this embodiment, the support substrate 501, such as a glass or silicon substrate, is bonded to a copper foil through a UV-curable adhesive layer 502, the copper foil is etched to form the first electrode film 513, the second electrode film 523, the third electrode film 533, and the fourth electrode film 543, the laminate structure of the support substrate 501 and the copper foil is perforated to form the first, second, third via holes, and Au is deposited into the first, second, third, and fourth via holes to form the first, second, third, and fourth vias 512, 522, 532, and 542 in contact with the first, second, third, and fourth electrode films 513, 523, 533, and 543, respectively.

A linear array of the vertical LED chips 200, 300, and 400 and the common electrodes 600 along one cross section and a straight arrangement of the patterned wiring layers 500 along the linear array are illustrated in FIG. 37. This is for convenience of illustration, and most preferably, three vertical LED chips 200, 300, and 400 and one common electrode 600 are arranged in a quadrangular array in each pixel unit (see FIG. 38). The patterned wiring layer 700 has a linear shape with a very narrow linewidth such that the areas of the vertical LED chips 200, 300, and 400 covered by the patterned wiring layer 700 can be minimized.

The plurality of LED pixel units 2 are mounted on the mount substrate 100.

The mount substrate 100 includes first wirings 110, second wirings 120, third wirings 130, and fourth wirings 140. The first wirings 110, the second wirings 120, the third wirings 130, and the fourth wirings 140 are individually connected to the first connection parts 510, the second connection parts 520, the third connection parts 530, and the fourth connection parts 540, respectively, to form power input/output ends, which individually drive the first vertical LED chips 200, the second vertical LED chips 300, and the third vertical LED chips 400. As mentioned above, the first connection parts 510, the second connection parts 520, the third connection parts 530, and the fourth connection parts 540 include the first vias 512, the second vias 522, the third vias 532, and the fourth vias 542, respectively. The lower ends of the first vias 512, the second vias 522, the third vias 532, and the fourth vias 542 are exposed through the bottom surfaces of the support substrates 501 and face the upper surface of the mount substrate 100.

Solders 190 connect the upper ends of the first wirings 110 to the first vias 512, connect the upper ends of the second wirings 120 to the second vias 522, connect the upper ends of the third wirings 130 to the third vias 532, and connect the upper ends of the fourth wirings 140 to the fourth vias 542. Portions of the solders 190 may be filled in the cavities of the first vias 512, the second vias 522, the third vias 532, and the fourth vias 542. The solders 190 filled in the cavities V of the vias 512, 522, 532, and 542 are hardened to fix the LED pixel units 2, ensuring more reliable bonding.

The first wirings 110 are connected in common to the first connection parts 510 of the plurality of LED pixel units 2, the second wirings 120 are connected in common to the second connection parts 520 of the plurality of LED pixel units 2, the third wirings 130 are connected in common to the third connection parts 530 of the plurality of LED pixel units 2, and the fourth wirings 140 are connected in common to the fourth connection parts 540 of the plurality of LED pixel units 2.

Each of the first wirings 110 includes a first wiring pattern 111 formed on a first insulating layer 101 and a first wiring via 112 having a lower end connected to the first insulating layer 101 and an upper end connected to the first via 512 through the solder 190. Each of the second wirings 120 includes a second wiring pattern 121 formed on a second insulating layer 102 and a second wiring via 122 having a lower end connected to the second insulating layer 102 and an upper end connected to the second via 522 through the solder 190. Each of the third wirings 130 includes a third wiring pattern 131 formed on the bottom surface of the second insulating layer 102 and a third wiring via 132 having a lower end connected to the third wiring pattern 131 and an upper end connected to the third via 532 through the solder 190. Each of the fourth wirings 140 includes a fourth wiring pattern 141 and a fourth wiring via 142 having a lower end connected to the fourth wiring pattern 141 and an upper end connected to the fourth via 542 through the solder 190.

The connections between the vertical LED chips 200, 300, and 400 of the LED pixel units 2 and the connection parts 510, 520, 530, and 540 and the connections between the connection parts 510, 520, 530, and 540 and the wirings 110, 120, 130, and 140 of the mount substrate 100 are illustrated in one cross section in FIG. 37. However, it is noted that these connections are not actually represented by one cross section.

Embodiments D-1, D-2 and D-3

Figure 38:
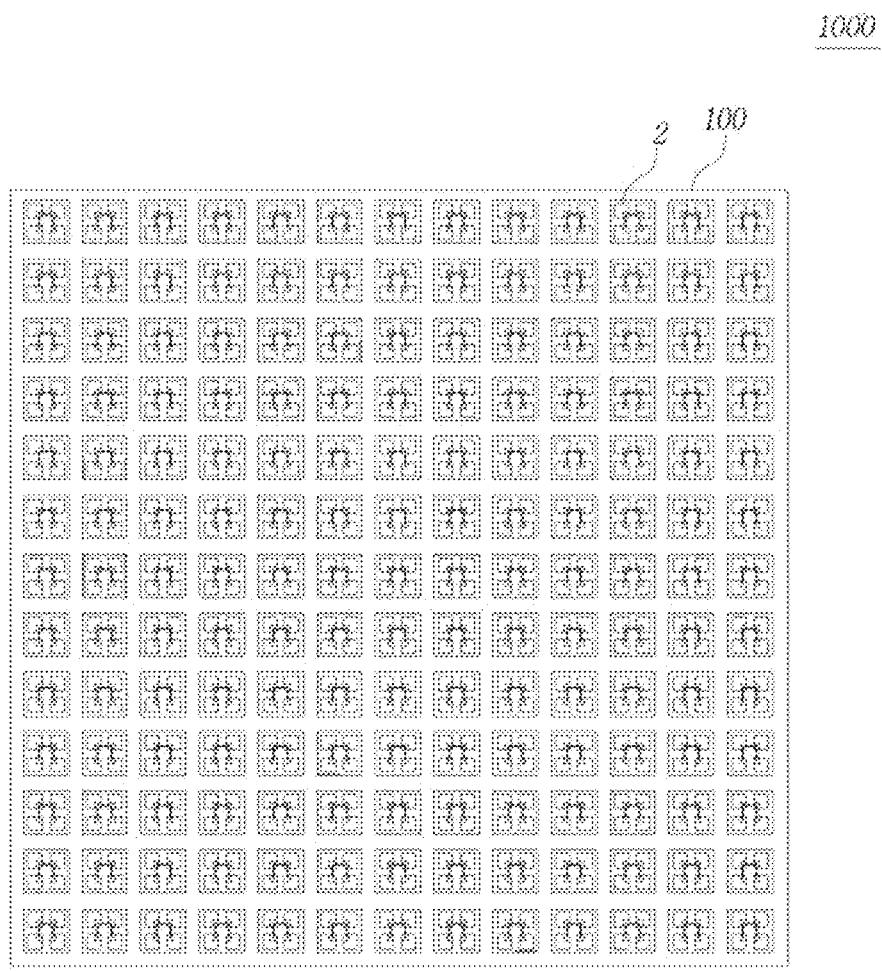
FIG. 38 is a plan view illustrating one embodiment of an LED display panel according to Embodiment D-1.
Figure 39:
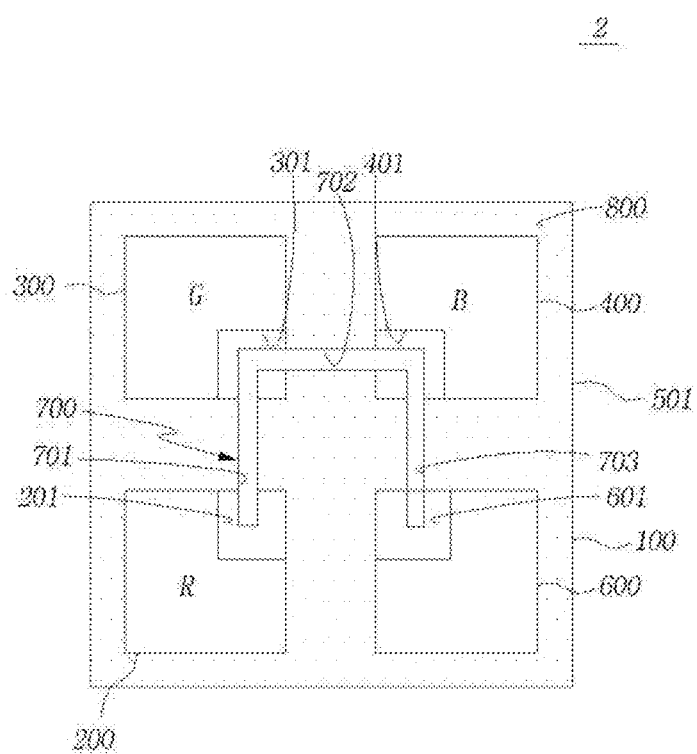
FIG. 39 is a plan view illustrating an LED pixel unit of the LED display panel according to Embodiment D-1.
Figure 40:
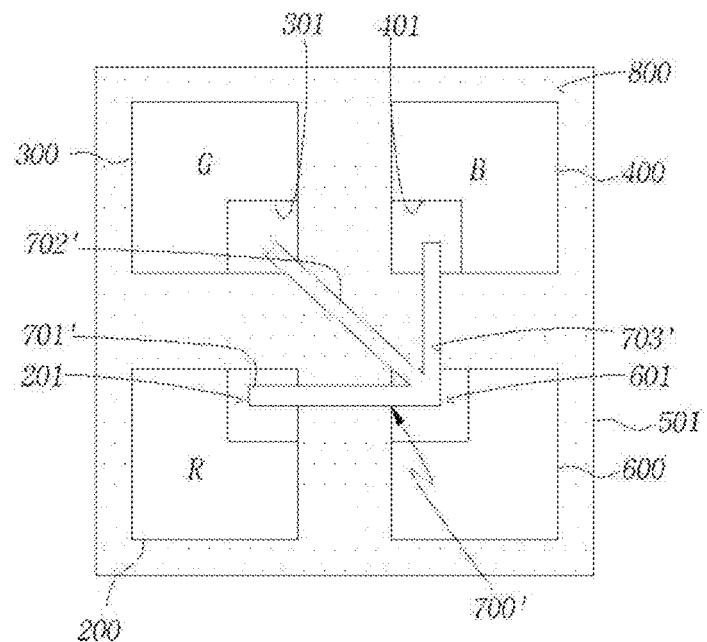
FIG. 40 is a plan view illustrating an LED pixel unit according to Embodiment D-2.
Figure 41:
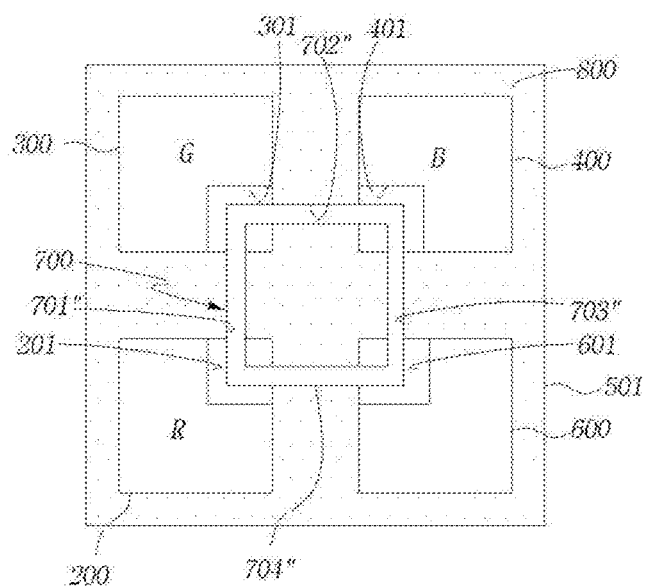
FIG. 41 is a plan view illustrating an LED pixel unit according to Embodiment D-3.

FIG. 38 is a plan view illustrating an LED display panel according to Embodiment D-1 and FIG. 39 is a plan view illustrating an LED pixel unit of the LED display panel. FIGS. 40 and 41 are plan views illustrating LED pixel units according to Embodiments D-2 and D-3, respectively. It should be noted that constitutions and connections illustrated in FIGS. 38 to 41 do not match those represented by one cross section in FIG. 37.

Referring to FIG. 38, the LED display panel 1000 includes a planar mount substrate 100 whose cross-section shape is square or rectangular and a plurality of LED pixel units 2 arrayed in a matrix on the mount substrate 100.

In each LED pixel unit 2, a first vertical LED chip 200, a second vertical LED chip 300, a third vertical LED chip 400, and a common electrode 600 are arranged in a quadrangular array on a support substrate 501, as illustrated in FIG. 39. In the support substrate 501, a first connection part 510 (see FIG. 37), a second connection part 520 (see FIG. 37), a third connection part 530 (see FIG. 37), and a fourth connection part 540 (see FIG. 37) are electrically connected to the bottom electrode of the first vertical LED chip 200, the bottom electrode of the second vertical LED chip 300, the bottom electrode of the third vertical LED chip 400, and the bottom portion of the common electrode 600, respectively. The bottom electrodes of the first vertical LED chip 200, the second vertical LED chip 300, and the third vertical LED chip 400 are connected to the mount substrate 100 through the first, second, and third connection parts 510, 520, and 530 (see FIG. 37) such that the vertical LED chips can be individually driven. The bottom portion of the common electrode 600 can be grounded to the mount substrate 100 (see FIG. 37) through the fourth connection part 540 (see FIG. 37).

The mount substrate may be the substrate illustrated in FIG. 37. Alternatively, the mount substrate may be a thin film transistor (TFT) substrate or a printed circuit board (PCB).

The upper surface of each of the first vertical LED chip 200, the second vertical LED chip 300, the third vertical LED chip 400, and the common electrode 600 has a width of 100 µm or less, most preferably 30 to 70 µm.

Each of the pixel units 2 includes a patterned wiring layer 700 electrically connecting the top portions of the first vertical LED chip 200, the second vertical LED chip 300, the third vertical LED chip 400, and the common electrode 600. Each of the pixel units 2 includes a support layer 800 formed in contact with the side surfaces of the first vertical LED chip 200, the second vertical LED chip 300, the third vertical LED chip 400, and the common electrode 600 to support the patterned wiring layer 700.

The first vertical LED chip 200, the second vertical LED chip 300, and the third vertical LED chip 400 are blue, green, and red LED chips, respectively, and each has a cubic or cuboidal shape. Each of the first vertical LED chip 200, the second vertical LED chip 300, and the third vertical LED chip 400 includes a first conductive semiconductor layer, a second conductive semiconductor layer, and an active layer interposed therebetween. The first vertical LED chip 200, the second vertical LED chip 300, the third vertical LED chip 400, and the common electrode 600 are arranged in a substantially square array.

A first connection area 201, a second connection area 301, a third connection area 401, and a fourth connection area 601 to which the patterned wiring layer 700 is connected are formed on the upper surfaces of the first vertical LED chip 200, the second vertical LED chip 300, the third vertical LED chip 400, and the common electrode 600, respectively. The first connection area 201, the second connection area 301, the third connection area 401, and the fourth connection area 601 are located at the corners closest to each other on the upper surfaces of the first vertical LED chip 200, the second vertical LED chip 300, the third vertical LED chip 400, and the common electrode 600, respectively.

Top electrodes of the first vertical LED chip 200, the second vertical LED chip 300, and the third vertical LED chip 400 may be provided in the first connection area 201, the second connection area 301, and the third connection area 401, respectively. The top electrodes may be disposed before formation of the patterned wiring layer 700 or may be formed as portions of the patterned wiring layer 700.

Bottom electrodes of the first vertical LED chip 200, the second vertical LED chip 300, and the third vertical LED chip 400 are individually connected to wires of the mount substrate 100 so that the first vertical LED chip 200, the second vertical LED chip 300, and the third vertical LED chip 400 can be individually driven.

An insulating resin material, such as epoxy, silicone, epoxy molding compound (EMC) or polyimide, is used to form the support layer 800 that is in contact with the side surfaces of the first vertical LED chip 200, the second vertical LED chip 300, the third vertical LED chip 400, and the common electrode 600. The use of the insulating resin material enables integration of the support layer 800 with the first vertical LED chip 200, the second vertical LED chip 300, the third vertical LED chip 400, and the common electrode 600. The support layer 800 plays a role in supporting the overlying patterned wiring layer 700, enabling the formation of the patterned wiring layer 700. Another role of the support layer 800 is to fixedly hold the first vertical LED chip 200, the second vertical LED chip 300, the third vertical LED chip 400, and the common electrode 600. The support layer 800 may be formed using a light-absorbing material, such as a black color material, or a light-reflecting material. In this case, the support layer 800 serves to prevent undesired interference of light emitted from the first vertical LED chip 200, the second vertical LED chip 300, and the third vertical LED chip 400. In addition, the support layer 800 does not reflect but absorbs light entering from the outside.

It is preferred that the upper surface of the support layer 800 lies at the same level as the upper surfaces of the first vertical LED chip 200, the second vertical LED chip 300, and the third vertical LED chip 400. Here, the upper surfaces of the first vertical LED chip 200, the second vertical LED chip 300, and the third vertical LED chip 400 may be the upper surfaces of the epistructures or the upper surfaces of the top electrodes formed on the upper surfaces of the epistructures.

The patterned wiring layer 700 is supported by the underlying support layer 800 and connects the first vertical LED chip 200, the second vertical LED chip 300, the third vertical LED chip 400, and the common electrode 600. The patterned wiring layer 700 is connected to only some of the corner areas of the first vertical LED chip 200, the second vertical LED chip 300, the third vertical LED chip 400, and the common electrode 600. Specifically, the patterned wiring layer 700 is connected to the first connection area 201, the second connection area 301, the third connection area 401, and the fourth connection area 601. This limited connection minimizes masking of the upper surfaces of the first vertical LED chip 200, the second vertical LED chip 300, and the third vertical LED chip 400 by the patterned wiring layer 700.

In this embodiment, the patterned wiring layer 700 is in a substantially angled "C" shape and consists of a first straight wiring 201 connecting the first connection area 201 of the first vertical LED chip 200 to the second connection area 301 of the second vertical LED chip 300, a second straight wiring 702 connected to one end of the first wiring 701 in the second connection area 301 of the second vertical LED chip 300 and connecting the second connection area 301 to the third connection area 401 of the third vertical LED chip 400, and a third straight wiring 703 connected to one end of the second wiring 702 in the third connection area 401 of the third vertical LED chip 400 and connecting the third connection area 401 to the fourth connection area 601 of the common electrode 600.

The support layer 800 completely covers the side surfaces of the first vertical LED chip 200, the second vertical LED chip 300, and the third vertical LED chip 400. The upper surface of the support layer 800 is preferably flat and lies at the same level as the upper surfaces of the first vertical LED chip 200, the second vertical LED chip 300, and the third vertical LED chip 400. The bottom surface of the support layer 800 is grooved between the neighboring vertical LED chips or between the common electrode and the neighboring vertical LED chips.

Embodiment D-2

FIG. 40 illustrates Embodiment D-2. Referring to FIG. 40, a patterned wiring layer 700' includes a first straight pattern 701' connecting the fourth connection area 601 of the common electrode 600 to the first connection area 201 of the first vertical LED chip 200, a second straight pattern 702' connecting the fourth connection area 601 of the common electrode 600 to the second connection area 301 of the second vertical LED chip 300, and a third straight pattern 703' connecting the fourth connection area 601 of the common electrode 600 to the third connection area 401 of the third vertical LED chip 400. The first straight pattern 701', the second straight pattern 702', and the third straight pattern 703' are connected to one another in the fourth connection area 601. Also in this embodiment, the patterned wiring layer 700' is in contact with and supported by an underlying support layer 800.

Embodiment D-3

FIG. 41 illustrates Embodiment D-3. Referring to FIG. 41, a patterned wiring layer 700" has a substantially square shape and includes a first straight pattern 701" connecting the first connection area 201 of the first vertical LED chip 200 to the second connection area 301 of the second vertical LED chip 300, a second straight pattern 702" connected to one end of the first straight pattern 701" in the second connection area 301 of the second vertical LED chip 300 and connecting the second connection area 301 to the third connection area 401 of the third vertical LED chip 400, a third straight pattern 703" connected to one end of the second straight pattern 702" in the third connection area 401 of the third vertical LED chip 400 and connecting the third connection area 401 to the fourth connection area 601 of the common electrode 600, and a fourth straight pattern 704" connected to one end of the third straight pattern 703" in the fourth connection area 601 and connecting the fourth connection area 601 to the first connection area 201.

As illustrated in FIG. 39, 40 or 41, the patterned wiring layer 700, 700' or 700" is connected to the corner areas of the first vertical LED chip 200, the second vertical LED chip 300, the third vertical LED chip 400, and the common electrode 600 without masking areas other than the corners of the first vertical LED chip 200, the second vertical LED chip 300, the third vertical LED chip 400, achieving higher luminous efficiency.

What is claimed is:

1. A light emitting element comprising:
   a mount substrate on which a first electrode pad, a second electrode pad, a third electrode pad, and a fourth electrode pad are disposed;
   a first vertical LED chip mounted on the mount substrate such that the bottom portion of the first vertical LED chip is connected to the first electrode pad;
   a second vertical LED chip mounted on the mount substrate such that the bottom portion of the second vertical LED chip is connected to the second electrode pad;
   a third vertical LED chip mounted on the mount substrate such that the bottom portion of the third vertical LED chip is connected to the third electrode pad;
   a light-transmitting conductive plate electrically connected to the top portions of the first vertical LED chip, the second vertical LED chip, and the third vertical LED chip;
   a conductor connecting the light-transmitting conductive plate to the fourth electrode pad, wherein the fourth electrode pad functions as a common electrode pad, and
   resistors arranged between the top portion of the first vertical LED chip and the conductor, between the top portion of the second vertical LED chip and the conductor, and between the top portion of the third vertical LED chip and the conductor under the light-transmitting conductive plate,
   wherein individual driving powers are applied to the first vertical LED chip, the second vertical LED chip, and the third vertical LED chip through the first electrode pad, the second electrode pad, and the third electrode pad, respectively, or through the fourth electrode pad.

2. The light emitting element according to claim 1, wherein the fourth electrode pad is a common input end of the individual driving powers while the first, second, and third electrode pads are individual output ends of the individual driving powers or an output end of the individual driving powers while the first, second, and third electrode pads are individual input ends of the individual driving powers.

3. The light emitting element according to claim 1, wherein the first vertical LED chip, the second vertical LED chip, and the third vertical LED chip are a blue LED chip, a green LED chip, and a red LED chip, respectively.

4. The light emitting element according to claim 1, wherein the light-transmitting conductive plate comprises indium tin oxide (ITO).

5. The light emitting element according to claim 1, wherein the light-transmitting conductive plate comprises a base of the light-transmitting plate and an indium tin oxide (ITO) pattern formed on the base of the light-transmitting plate.

6. The light emitting element according to claim 1, further comprising an electrically insulating underfill filled between the mount substrate and the light-transmitting conductive plate.

7. The light emitting element according to claim 1, wherein the top and bottom portions of the first vertical LED chip, the second vertical LED chip, and the third vertical LED chip have opposite electrical polarities.

8. The light emitting element according to claim 7, wherein each of the first vertical LED chip, the second vertical LED chip, and the third vertical LED chip comprises an n-type semiconductor layer, an active layer, and a p-type semiconductor layer between the top and bottom portions thereof.

9. The light emitting element according to claim 1, wherein at least one of the first vertical LED chip, the second vertical LED chip, and the third vertical LED chip comprises a top surface free from a semiconductor layer growth substrate.

10. The light emitting element according to claim 1, wherein the distance between the first vertical LED chip and the second vertical LED chip is the same as that between the second vertical LED chip and the third vertical LED chip.

11. A method for manufacturing light emitting elements, comprising:
preparing a mount substrate comprising a plurality of pad groups, each of which comprises a first electrode pad, a second electrode pad, a third electrode pad, and a fourth electrode pad;
mounting a plurality of first vertical LED chips on the mount substrate such that the bottom portions of the first vertical LED chips are connected to the first electrode pads;
mounting a plurality of second vertical LED chips on the mount substrate such that the bottom portions of the second vertical LED chips are connected to the second electrode pads;
mounting a plurality of third vertical LED chips on the mount substrate such that the bottom portions of the third vertical LED chips are connected to the third electrode pads;
placing a plurality of conductors on the mount substrate such that the conductors are connected to the fourth electrode pads;
attaching a light-transmitting conductive plate to the top portions of the first vertical LED chips, the second vertical LED chips, and the third vertical LED chips and the upper surfaces of the conductors to construct a panel, wherein the fourth electrode pad functions as a common electrode pad;
arranging resistors under the light-transmitting conductive plate between the top portions of the first vertical LED chips and the conductors, between the top portions of the second vertical LED chips and the conductors, and between the top portions of the third vertical LED chips and the conductors; and
cutting the panel into the individual pad groups.

12. The method according to claim 11, wherein the mounting of first vertical LED chips comprises preparing a first wafer comprising a sapphire substrate and a plurality of first vertical LED chips disposed on the sapphire substrate, bonding the bottom portions of the plurality of first vertical LED chips to the plurality of first electrode pads, and removing the sapphire substrate from the plurality of first vertical LED chips by a laser lift-off (LLO) process.

13. The method according to claim 11, wherein the mounting of second vertical LED chips comprises preparing a second wafer comprising a sapphire substrate and a plurality of second vertical LED chips disposed on the sapphire substrate, bonding the bottom portions of the plurality of second vertical LED chips to the plurality of second electrode pads, and removing the sapphire substrate from the plurality of second vertical LED chips by a laser lift-off (LLO) process.

14. An LED display module comprising:
a mount substrate comprising a plurality of pad groups arrayed in a matrix thereon, each of the pad groups comprising a first electrode pad, a second electrode pad, a third electrode pad, and a fourth electrode pad;
a light-transmitting plate spaced apart from the upper surface of the mount substrate and comprising a plurality of electrode patterns arrayed in a matrix thereon; and
a plurality of pixel units located between the mount substrate and the light-transmitting plate arrayed in a matrix,
wherein each of the plurality of pixel units comprises a first vertical LED chip mounted on the mount substrate such that the bottom portion of the first vertical LED chip is connected to the first electrode pad, a second vertical LED chip mounted on the mount substrate such that the bottom portion of the second vertical LED chip is connected to the second electrode pad, a third vertical LED chip mounted on the mount substrate such that the bottom portion of the third vertical LED chip is connected to the third electrode pad, and a conductor provided on the mount substrate such that the bottom portion of the conductor is connected to the fourth electrode pad,
wherein the top portions of the first vertical LED chip, the second vertical LED chip, the third vertical LED chip, and the conductor are connected in common to one of the plurality of electrode patterns, and
wherein the first vertical LED chips, the second vertical LED chips, and the third vertical LED chips are individually controlled such that the colors of light emitted from the pixel units are changed.

15. The LED display module according to claim 14, wherein the plurality of electrode patterns are light transmissive.

16. The LED display module according to claim 14, wherein the plurality of electrode pads are made of indium tin oxide (ITO) on one surface of a base of the light-transmitting plate.

17. The LED display module according to claim 14, wherein the mount substrate is a TFT substrate.

18. The LED display module according to claim 14, wherein the first vertical LED chips, the second vertical LED chips, and the third vertical LED chips are blue LED chips, green LED chips, and red LED chips, respectively.

19. The LED display module according to claim 14, further comprising an electrically insulating underfill filled between the mount substrate and the light-transmitting plate.

20. The LED display module according to claim 14, wherein the top and bottom portions of the first vertical LED chips, the second vertical LED chips, and the third vertical LED chips have opposite electrical polarities.

21. The LED display module according to claim 20, wherein each of the first vertical LED chips, the second vertical LED chips, and the third vertical LED chips comprises an n-type semiconductor layer, an active layer, and a p-type semiconductor layer between the top and bottom portions thereof.

22. The LED display module according to claim 14, wherein at least one of the first vertical LED chip, the second vertical LED chip, and the third vertical LED chip in each of the pixel units comprises a top surface free from a semiconductor layer growth substrate.

23. The LED display module according to claim 14, further comprising resistors arranged between the top portion of the first vertical LED chip and the conductor, between the top portion of the second vertical LED chip and the conductor, and between the top portion of the third vertical LED chip and the conductor under the light-transmitting conductive plate in each of the pixel units.

24. The LED display module according to claim 14, wherein the distance between the first vertical LED chip and the second vertical LED chip is the same as that between the second vertical LED chip and the third vertical LED chip in each of the pixel units.

* * * * *